(12) United States Patent
Dobbs et al.

(10) Patent No.: US 9,154,142 B2
(45) Date of Patent: Oct. 6, 2015

(54) MULTI-FREQUENCY CLOCK SKEW CONTROL FOR INTER-CHIP COMMUNICATION IN SYNCHRONOUS DIGITAL SYSTEMS

(71) Applicant: COHERENT LOGIX, INCORPORATED, Austin, TX (US)

(72) Inventors: Carl S. Dobbs, Austin, TX (US); Michael R. Trocino, Austin, TX (US); Kenneth R. Faulkner, Austin, TX (US); Christopher L. Schreppel, Austin, TX (US)

(73) Assignee: Coherent Logix, Incorporated, Austin, TX (US)

( * ) Notice: Subject to any disclaimer, the term of this patent is extended or adjusted under 35 U.S.C. 154(b) by 0 days.

(21) Appl. No.: 14/626,441

(22) Filed: Feb. 19, 2015

(65) Prior Publication Data

US 2015/0162920 A1    Jun. 11, 2015

Related U.S. Application Data

(63) Continuation of application No. 14/106,269, filed on Dec. 13, 2013, now Pat. No. 8,963,599.

(60) Provisional application No. 61/736,763, filed on Dec. 13, 2012.

(51) Int. Cl.
*H03L 7/06* (2006.01)
*H03L 7/085* (2006.01)

(52) U.S. Cl.
CPC .................................... *H03L 7/085* (2013.01)

(58) Field of Classification Search
None
See application file for complete search history.

(56) References Cited

U.S. PATENT DOCUMENTS 5,184,027 A    2/1993   Masuda
5,619,158 A    4/1997   Casal
(Continued)

FOREIGN PATENT DOCUMENTS

EP    0 359 177 A2    3/1990
GB    2 348 555 A    10/2000

OTHER PUBLICATIONS

Mahmud, Rafey "Techniques to Make Clock Switching Glitch Free" EETimes Jun. 26, 2003 (7 pages).
(Continued)

*Primary Examiner* — Lincoln Donovan
*Assistant Examiner* — Khareem E Almo
(74) *Attorney, Agent, or Firm* — Meyertons Hood Kivlin Kowert & Goetzel, P.C.; Jeffrey C. Hood; Matthew C. Washburn

(57) ABSTRACT

Embodiments are disclosed of an apparatus capable of performing multi-rate synchronous communication between component chips. Each chip may receive a common clock reference signal, and may generate an internal clock signal dependent on the clock reference signal. A clock distribution tree and phase-locked loop may be used to minimize internal clock skew at I/O circuitry at the chip perimeter. Each chip may also generate an internal synchronizing signal that is phase-aligned to the received clock reference signal. Each chip may use its respective synchronizing signal to synchronize multiple clock dividers that provide software-selectable adjusted-frequency clock signals to the I/O cells of the chip. In this way, the adjusted-frequency clock signals of the multiple chips are edge-aligned to the low-skew internal clock signals, and phase-aligned to the common clock reference signal, allowing the I/O cells of the multiple chips to perform synchronous communication at multiple rates with low clock skew.

20 Claims, 15 Drawing Sheets

(56) References Cited

U.S. PATENT DOCUMENTS

| | | | |
|---|---|---|---|
| 5,764,965 | A | 6/1998 | Poimboeuf |
| 5,811,987 | A | 9/1998 | Ashmore |
| 7,415,594 | B2 | 8/2008 | Doerr |
| 8,122,277 | B1 | 2/2012 | Chandra |
| 8,205,110 | B2 | 6/2012 | Petrick |
| 8,552,770 | B2 | 10/2013 | Cavin |
| 8,880,866 | B2 | 11/2014 | Doerr |
| 2004/0212416 | A1* | 10/2004 | Buchwald et al. ............ 327/248 |
| 2005/0206416 | A1* | 9/2005 | Kizer ............................ 327/156 |
| 2008/0094117 | A1* | 4/2008 | Stoler et al. .................. 327/162 |

OTHER PUBLICATIONS

Vangal, Siram et al. "An 80-Tile 1.28TFLOPS Network-on-Chip in 65nm CMOS" 2007 IEEE International Solid-State Circuits Conference; Feb. 11-15, 2007; ISSCC Digest of Technical Papers; pp. 98, 99, 589 (3 pages).

Friedman, Eby G. "Clock Distribution Networks in Synchronous Digital Integrated Circuits" Proc. IEEE vol. 89 Issue 5; May 2001; pp. 665-692 (28 pages).

International Search Report for Application No. PCT/US2013/075132, mailed Apr. 16, 2014; 4 pages.

* cited by examiner

MULTI-FREQUENCY CLOCK SKEW CONTROL FOR INTER-CHIP COMMUNICATION IN SYNCHRONOUS DIGITAL SYSTEMS

PRIORITY CLAIM

The present application is a continuation application of copending application Ser. No. 14/106,269, which will issue as U.S. Pat. No. 8,963,599, titled "MULTI-FREQUENCY CLOCK SKEW CONTROL FOR INTER-CHIP COMMUNICATION IN SYNCHRONOUS DIGITAL SYSTEMS", and filed on Dec. 13, 2013, which claims benefit of priority of provisional application Ser. No. 61/736,763 titled "Clock Distribution Network for Multi-Frequency Multi-Processor Systems" and filed on Dec. 13, 2012, which is hereby incorporated by reference in its entirety as though fully and completely set forth herein.

BACKGROUND

1. Technical Field

This application relates to electronic systems and, more particularly, to clock signal distribution networks within digital electronic systems, and especially to clock distribution within integrated circuit (IC) chips that contain many processing units.

2. Description of the Related Art

For large, expensive computer systems, their economics dictates that they be kept busy all the time. Performance was traditionally measured as computations per second. For small, inexpensive computers, continuous high speed operation is not required, and is even a hindrance for battery operated devices. Increasingly computer and digital signal processor (DSP) performance is measured in computations per second per watt or computations per joule of energy used.

While there are entertainment applications that require high performance operation for hours at a time, most uses of small computers require bursts of high performance for less than a minute. In fact there are many time intervals when a small embedded computer or digital signal processor (DSP) may operate just fine at reduced speeds. Since the circuit technologies for microcomputers consume electrical power in proportion to compute speed; opportunities to run at reduced speed are opportunities to reduce power consumption and conserve battery charge. The opportunities may be greatest for personal electronic devices (PEDs), where human interests and attention place highly variable demands on the micro-computers and DSPs embedded therein.

Single Processor Systems

In a computer with only one processing unit, the processor can adjust its own speed by writing to special circuits that generate the system clock signal. This may be used to match the system clock frequency to the average workload. However reduced system clock frequency (or rate) also slows the resident kernel of the operating system software and its response time. Depending on implementation, users may notice pauses when the machine needs to up-shift to a faster clock rate for more computation per second type of performance.

Single-processor computers and their control software, often also have user adjustable time-outs; and the more power-down modes in the hardware, the more finely the system can adapt its power use to actual demand for computation. For example, a processor may switch to a reduced speed and reduced supply voltage state after an initial timeout, into a clock-stopped state after a longer timeout; and into a low voltage sleep state after a yet longer timeout. These low voltage states maintain data in volatile memory, which is advantageous to quick re-activation. If a processor's power is completely cut off the data in its volatile memory is lost; and upon re-activation of the processor, data will have to be reloaded from non-volatile memory.

Multi-Processor Systems

Large multiprocessor systems have pioneered many techniques to improve computations per second but have been less aggressive with power management. With the advent of PEDs using in-expensive IC chips containing multiple processing units, the demand for energy efficiency has increased a great deal.

Advantages of multiprocessing include much higher computational throughput for algorithms converted for parallel execution, and increased reliability and security due to separation of processes onto different processors and memories. In a multiprocessor system it is much less likely that a supervisory process executing on its own processor will be delayed by an application process executing on other processors.

Within applications, some processors may be slowed and others accelerated depending on external events. For example, the performance of a video processor for display of video data many depend on type of data and user activity. (In this example a video processor may be a single unit specialized for video, or it may be a group of processing elements programmed to processes video in a parallel way). If a user is editing video there may be frequent pauses in the display of motion. While paused, the video processor may be lowered to idle speed, ready to respond but dissipating less power than full speed. Meanwhile the user interface may be handled by a different processor optimized to for user interaction.

Another way to conserve power in a multi-processor system is to arrange for multiple processors to run on a variety of clock frequencies—fast clocks for critical paths in a computation and slower clocks for other parts. Since the opportunities to save power are highly dependent on application software, the clock distribution hardware should be configurable, preferably configurable rapidly from application software.

Multi-processor Arrays

Increasingly, digital electronic systems, such as computers and digital signal processors (DSP), utilize one or more multi-processor arrays (MPAs). An MPA may be loosely defined as a plurality of processing elements (PEs), supporting memory (SM), and a high bandwidth interconnection network (IN). As used herein, the term "processing element" refers to a processor or CPU (central processing unit), microprocessor, or a processor core. The word "array" in MPA is used in its broadest sense to mean a plurality of computational units (each of which may contain processing and/or memory resources) interconnected by a network with connections available in one, two, three, or more dimensions, including circular dimensions (loops or rings). Note that a higher dimensioned MPA can be mapped onto fabrication media with fewer dimensions, provided that the media supports the increased wiring density. For example, an MPA with the shape of a four dimensional (4D) hypercube can be mapped onto a 3D stack of silicon integrated circuit (IC) chips, or onto a single 2D chip, or even a 1D line of computational units. Also low dimensional MPAs can be mapped to higher dimensional media. For example, a 1D line of computation units can be laid out in a serpentine shape onto the 2D plane of an IC chip, or coiled into a 3D stack of chips. An MPA may contain multiple types of computational units and interspersed arrangements of processors and memory. Also included in the broad sense of an MPA is a hierarchy or nested arrangement of MPAs, especially an MPA composed of interconnected IC chips where the IC chips contain one or more MPAs which may also have deeper hierarchal structure.

There may be one or more interconnection networks (INs) in an MPA or between MPAs of differing type. The purpose of interconnection networks in MPAs is to move data, instructions, status, configuration, or control information between and among PE, SM, and I/O. The primary interconnection network (PIN) is designed for high bandwidth data movement, with good but not extremely low latency (the time delay for the delivery of data between source and destination). The data moved by the PIN may encapsulate other types of information provided there is hardware or software at the data destination that is able to translate the data to the other types of information. An MPA may have other, secondary INs; these may exhibit lower or higher latency but generally will have much lower bandwidth.

An IN is composed of links and nodes. A link is typically composed of a set of parallel "wires" implemented as electrically conductive paths (tracks or traces) on a circuit board or an IC. A node contains ports for coupling to the links, which contain the transmitter and receiver circuits to send and receive signals on the links. A node may have other ports for communications with PE or SM. A node has a Router which contains data paths and switches for connecting ports to each other, plus a router control mechanism for selectively connecting ports according to one or more protocols.

To achieve high bandwidth each link of the PIN may include many parallel wires. If the distance between nodes is small, links are short and standard CMOS binary signaling scheme may be used; which is that a steady signal voltage near the high side of the power supply is a signal state (H) that represents a logical 1 and a steady signal voltage near the low (or ground) side of the power supply is the other binary state (L) and represents a logical 0. In this signaling scheme one wire encodes one bit of information. If the length of a link is long, such as between IC chips or between circuit boards, then different signaling schemes may be better suited to maintain high speed and reject noise.

The parallel wires in a link may carry data or clock signals. The purpose of a clock signal is to mark points in time where transmit circuits may change data signals and where receive circuits may sample data signals. In a properly designed circuit the sampling time occurs after a changed data signal settles to a steady-state value. A transmitter may use a clock signal to trigger when it drives a line to signal state H or L; a receiver circuit may use a clock signal to latch the data signals into a register. A common convention is that a receiver latches data on the rising (0 to 1) transition of its clock signal, while a transmitter updates its outputs at the falling (1 to 0) transition of its clock signal. These signal state transitions take a finite amount of time to complete but if the rise and fall intervals are short compared to the interval used to represent a bit, the transitions may also be referred to as "edges".

If a clock signal is shared amongst multiple transmitters and receivers, then they are said to be synchronized and the data transfer is generally referred to as "synchronous" data transfer. "Asynchronous" data transfer is simply any scheme where data signals may be transmitted and received without the use of a common clock signal. An asynchronous receiver is more flexible for sampling data signals than a synchronous receiver. In particular, it may sample and latch data at timepoints that are quite different from its local clock signal. Some asynchronous receivers work by oversampling the input to look for data signal transitions. Simpler asynchronous receivers accept a clock (or strobe) input signal that originates with the transmitter and is carried along with data; the strobe input latches the data at the front end of the receiver and it is then buffered and retimed for synchronous outputs.

Data flow on a link may need to be interrupted by either the transmitter or receiver. If the transmitter temporarily has no new data to send, the receiver may erroneously keep reading the last bit of data unless it gets a not-ready signal from the transmitter. Similarly, if the receiver temporarily has no place to put data, it may erroneously ignore arriving data unless it can tell the transmitter to stop sending. Interconnection networks may have special signals devoted to flow control and protocols for what nodes are supposed to do when these signals change state. These special signals may be wires in the link itself or they may be code patterns in the set of wires. Protocols are implemented with simple state machines.

In a typical microprocessor IC chip the data transfers are synchronous. However, the pursuit of higher performance (computations per second) has pushed clock frequencies higher and higher (currently around 2 GHz). Clock frequencies this high are reasonable inside an IC where wires are physically short, but are difficult to manage for the chip I/O and inter-chip links.

Signals propagate on circuit boards at very high speeds (on the order of 4-6 inches per nanosecond), but for fine wire "traces" on a circuit board, a transmitter can develop rise and fall times shorter than a nanosecond. With fast enough rise and fall times, several clock/data transitions (or edges) may be in transit on the signal wires between IC chips at any given moment.

On almost any microprocessor IC chip the clock signals used with the chip I/O circuits are not as high as the clock signals used in the core. High bandwidth, on the order of 4 Giga words (16 bit each word) per second, between nearby chips on a circuit board may be obtained with parallel-wires, low-voltage differential signaling (LVDS) and synchronous data transfer. Between circuit boards, high bandwidth may be obtained with parallel wires or optical fibers and synchronous or asynchronous data transfers. Specialized circuits and controllers are used with external memory chips, such as the popular double data rate (DDR) series of interfaces. Specialized circuits are also used for high speed bit-serial communication, such as serializer & deserializer (SERDES) circuits.

To build large systems composed of multiple VLSI chips and synchronous parallel inter-chip communication, IO clocks are preferably generated in such a way that they will be synchronized across multiple IC chips. Typically this is achieved with a phase-locked loop (PLL) in each chip. The PLL maintains a constant averaged phase relation between a clock reference signal generated externally and the clock signals inside the chip. Typically the reference clock frequency is much lower than the internal clock frequencies in order to limit bandwidth and noise introduced into the reference clock signal, and/or to use the output of crystal controlled oscillators.

Multi-Frequency Clocks

The PE, SM, IN, and clock distribution network for an MPA need to be more power efficient per processor than for conventional microprocessors, simply because there are 10 to 100 times more processors in each MPA IC chip, and a reasonable chip size and package for it have a limited capacity to dissipate heat.

MPA clock distribution and its control mechanisms also should be more flexible because with larger numbers of processors there is greater fluctuation in the instantaneous demand for their operation.

In multi-processor systems, processors can be configured to control the supply voltage and clocking frequency of other processors for the purpose of conserving overall power dissipation. A simple approach is to turn off the clock to processors that are temporarily not needed and for longer intervals to turn off their power. A more sophisticated approach involves preparing processors at low speeds for use at high speeds.

For a processor and memory, turning power back on and resuming processing is much more complicated than turning it off. When power comes up the processor is in a random state that requires a reset of the circuits followed by clock turn on. Then an initialization sequence is required to bring the processor to a known ready state, reload support memory, and begin execution of application software.

If all of this takes too long for the application, then it may be useful to prepare a processor at a low clock frequency (conserving power), so that it may resume full speed operation with only a few microseconds of advance notice.

Power Consumption

To see how energy can be conserved with parallel computing, we briefly review the ways that digital CMOS circuits use power. Basically the average power use depends on supply voltage and clocking frequency.

In CMOS digital circuits logical ones and zeroes are represented by high and low voltage levels on signal lines. The state of a signal line is high or low. Power is used to change (or switch) the state of each signal, otherwise the circuit sits in a quiescent state that dissipates a much smaller amount of power, which is due only to leakage currents. The energy required to switch a signal line from high to low or low to high is mostly proportional to the total electrical capacitance, C, of the line and the transistors connected to it. The power supply current required by a transistor to switch a signal line at first surges and then decays—much like the current through a switch to charge a capacitor. The integrated current through the transistor for the switching event (in amp*seconds) is equal to the change in the charge, Q, on the total capacitance, C. From the physics of capacitors, Q=C*V where C is in farads and V in volts. Repeated charging and discharging at some frequency f results in an average switching power of:

$$P\text{avg} = I*V = f*C*V*V = f*C*V^2$$

This linear relation of power consumption to frequency holds over a wide range, many orders of magnitude. At very low frequencies there is a power floor where the dc leakage currents will dominate the overall power consumption. At very high frequencies the transistors are not fast enough to completely switch the signal lines, and this causes bit errors and excess supply current. Often the bit errors can be suppressed by increasing the V of the supply but this causes a quadratic increase in power until the circuits are damaged by overheating.

If a CMOS circuit does not need to run fast, then Pavg can be reduced by operation at lower frequency, and further reduced by reducing the supply voltage. However, operation at lower voltages results in less charge/discharge current per transistor. Below a threshold voltage, Vth, the transistors are off (except for tiny sub-threshold currents).

Energy Saving Opportunity for Parallel Computing

The opportunity for parallel computing is that computations per unit energy are lower than with a unitary processor. To see how this is so, consider a computation that requires 1 billion operations. On a unit processor at 1 GHz this may take about 1 s at a power supply of say 100W (averaging 500 mA at 2V) or about 100 joules of energy. If 100 processors of the same type and power supply are used, the computation time may be reduced, ideally by the number of processors, but due to communication overhead, a reduction of 50× to 20 ms is more likely. The energy required has doubled because there are 100 times as many processors running at 1/50 the time interval. However, we can slow the processors down by 50× to 20 MHz and complete the fixed computation in the original 1 s interval. This reduces the power dissipation per processor to 2W.

But now the supply voltage can be reduced because the transistors do not need to charge and discharge the capacitances so quickly.

Actual IC chips may have minimum supply voltage specifications that are closer to about half of the maximum supply voltage specification, often due to internal circuits designed for high speed.

Generalizing: With N times as many processors at work on a large computation, and the same amount of time to complete it, the clocking frequency, F, can be reduced by a conservative estimate of ~2/N, and then Vsupply can be reduced by about a factor of two for 10<N<100. The average dynamic power per processor is reduced by $(Fp/Fs)*(Vp/Vs)^2$, where the p subscripts refer to the parallel computation and the s subscripts refer to single processor computation. So, for the N processors the typical dynamic power reduction compared to a single fast processor is:

$$Pp/Ps = N*2/N*(1/2)^2 = 1/2$$

Also the static power consumption due to leakage currents may be reduced by lower supply voltages as well.

This strategy has its physical limits, of course. With Vdd a few tenths of a volt above transistor turn-on voltage (Vth) the statistical scatter of Vth becomes a limiting factor. Future improvements in fabrication technology may reduce the scatter of Vth.

In an MPA, additional power savings can be made in the clock distribution network itself if the requirements on clock skew between distant parts of the array can be relaxed. This is possible in MPAs where most signal paths are short, connecting only to nearby circuit blocks. For example, the HyperX architecture (ref U.S. Pat. No. 7,415,594) has this property that a very high percentage of the signal paths are short in length.

Exemplary Multiprocessor IC

FIG. 1 illustrates an embodiment of a multiprocessor IC for the purpose of illuminating clock distribution network design issues/problems addressed by an embodiment of this application. As illustrated in FIG. 1, exemplary hx3100A multiprocessor IC comprises an MPA, which receives as inputs a clock signal CLK1 and a synchronizing signal SYNC. The CLK1 and SYNC signals are generated by a CLK1+SYNC Generator. The CLK1+SYNC Generator receives as inputs a clock reference signal CLKREF, a clock bypass signal Bypass, and a system synchronization signal SYNCIN. Other inputs and other components present on the hx3100A multiprocessor IC are not illustrated. Clock reference signal CLKREF is a system reference clock that may be used to synchronize operations between different chips, and is illustrated in FIG. 1 as being generated by an oscillator OSC1. Components in this and other figures are not shown to scale.

The MPA of the hx3100A multiprocessor IC has a 10×10 array of PE that are interspersed in an 11×11 mesh of nodes of an interconnection network (IN). Each IN node contains shared data memory (DM) to support the neighboring four PE; and each PE may access shared DM in the four neighboring nodes surrounding it. Each PE has private instruction memory (IM).

The chip is divided into four quadrants for internal dc power supply distribution; the positive side of the power distribution network is divided into four "voltage islands" that may be separately coupled to external power supplies.

The negative side of the distribution network is coupled to system zero reference "ground."

The circuits crossing the boundaries between quadrants may be designed simply to operate with adjacent voltage islands at the same voltage and to self-protect when one voltage island is switched off. The circuits crossing the boundary may be made further capable of operation with adjacent voltage islands at different non-zero voltages with the addition of level-shifting circuits. Level shifting circuits are well known in the industry, and easily added, but they may introduce additional power dissipation and signal delay.

The clock distribution network for the hx3100A chip supports moderately large (16×) frequency differences between the processors and their supporting memory (SM) elements and interconnection network (IN) while maintaining an overall synchronous array. All processor memory accesses and data transfers in the core array occur in step with a global clock signal.

The hx3100 has a clock tree with distributed regenerators architecture. It distributes a clock signal to every part of the chip with relatively low power dissipation while limiting clock skew between PE and local nodes. An H tree was also considered, but it would have had more regenerators than the tree chosen, and thus would dissipate more power. The disadvantage of this tree compared the H tree is that the central area has a clock signal that is skewed (phase advanced) in steps with respect to the perimeter of the chip. However the multiprocessor architecture for which it is designed has mostly short links and connections to nearest neighbors, and thus good tolerance of the skew between steps.

FIG. 2 shows that the chip is divided into a checkerboard of macrocells, each served by a regenerator output, and having a uniform clock signal phase and internally synchronous operation.

In the concept of concentric window-frame time zones, centrally located zones may tap off the clock network closer to its root. The overall effect is that fewer regenerators are needed vs. the H-tree. The circles in the diagram represent regenerators. Each regenerator has one or more outputs to drive other regenerators and/or macrocells (checkerboard squares). Each output to a macrocell has a configurable divide and delay cell (not shown in the figure). The global clock signal CLK1 and synchronization signal SYNC are generated at the edge of the chip by the CLK1+SYNC Generator, and are communicated to the central clock regenerator.

The central clock regenerator distributes clock and sync in four directions to each of the four quadrants of the chip and to additional regenerators in each quadrant. Additional branches are added as the tree extends toward the perimeter of the chip. Except for the central clock regenerator the regenerator cells have outputs for local macrocells. The tree builds up a series of time zones shaped approximately like concentric window frames—though each frame need not have exactly rectangular boundaries or make a complete loop.

On the hx3100A chip, a macrocell may be composed of one PE and one IN node, the IN node containing a DM and a Router and also referred to as a data-memory router (DMR). On other types of chips a macrocell may contain different numbers of these elements.

The hx3100A clock distribution network provides a selection of clock frequencies for each PE while maintaining a uniform high frequency for the DMRs. Individual PEs may be configured to operate at reduced clock frequency using clock dividers located in the regenerators.

Power-of-two fractional frequencies ($1/(2^N)$) are easily generated with a binary counter of length of N bits as illustrated in FIG. 3. The hx3100A chip regenerators use a 4 bit counter and an output selector so that fractions of ½, ¼, ⅛, and 1/16 are supported. If the counter is excessively long (to cover a wider range of frequencies) it begins to take up excess silicon real-estate and adds to leakage power dissipation.

The SYNC signal is not a clock but a pulse one CLK1 period wide that is broadcast with CLK1 on every 16th cycle of CLK1 and it is used to synchronize the PE clock dividers in the regenerators, as shown in the waveforms of FIG. 4. As shown in FIG. 3, SYNC is used to reset the counters every 16 cycles. Without the SYNC signal each divider may have started counting at a different time and therefore the different counters may be out of phase with each other in increments of CLK1 cycles. RegP is the configuration register for the regenerator, and it is accessible by application software. Updates of RegP outputs are aligned to the SYNC signal.

Data and address buffers are located between PEs and DMRs and between DMRs to hold data during stall intervals. While originally used to control the flow of data, the same mechanism aids the interface of slowed PEs to full speed DMRs.

DMRs are not run slow so as to maintain the bandwidth of the interconnection network; but they can be suspended (clock input halted). Normally the DMR power dissipation also varies with request rate, and if neighboring slowed PEs are making requests at a slower rate, the DMR power dissipation will also decrease.

FIG. 5 shows a way to generate the global CLK1 and SYNC signals that are used on the hx3100A. The PLL is configured by chip inputs. When the PLL is activated it will, after many cycles, phase lock to the average frequency and phase of chip input CLKREF, a square wave. The output of the PLL is shown as the highest frequency clock (HFC), also a square wave, and it may have a frequency that is typically 8 to 128 times higher than CLKREF depending on configuration.

Multiplexer M1, configured by software-accessible Reg0 through Logic1, selects either HFC or CLKREF input, and outputs CLK0 signal coupled to clock divider DIV1. Clock divider DIV1 is configured through Logic1 to produce same or reduced frequency CLK1 which is the highest frequency clock signal sent into the core array. A counter, CNT0, and logic gate, NOR1, may be used to generate the SYNC signal.

The counter CNT0 may be periodically reset by the chip input signal SYNCIN. In a multichip system, one hx3100A may be selected to have a master CNT0, and the other hx3100A chips may be slaved to it by receiving a SYNCIN signal from the SYNCOUT signal generated by the master CNT0. However, at high clock rates it is difficult to align the phase of the inter-chip sync signals to properly reset CNT0, which is running on a clock phase locked to CLKREF. Also, any DIV1 I/O frequency ratio other than unity results in possible phase offsets between the internal SYNC signals of the chips of multiples of the HFC cycle.

In most multichip systems, the interconnections between chips are operated for data transfers at lower rates than the on-chip interconnections are operated. This is done both for signal integrity and power dissipation reasons. If the CLK1 on both chips is adjusted down to a rate that the interchip connections can support without distortions, then reliable synchronous communication between the chips can commence. However, this limits the speed of the PEs and DMRs in the core of the chip and thus the range of applications. Thus there is a need to slow the clocks of the I/O cells relative to CLK1. Benefits of slowed I/O cells are that for slowdown ratios less than about 1000, their power dissipation comes down almost proportionate to the slowdown ratio, and the timing margins improve as the data pulse widths increase.

In the hx3100A chip, an I/O cell receives a clock signal from the last regenerator in a clock distribution branch and from an output that would have gone to a PE had one been located in the I/O cell location. The regenerator contains a clock divider that takes CLK1 and SYNC inputs. Thus an I/O cell clock rate may be configured in the same way as a PE clock rate, and be configured to a clock rate slower than CLK1, as desired for interchip connections. Internal to the chip, an I/O cell clocked this way maintains synchronous communication with the nearest DMR and through the on-chip network (IN) to the rest of the DMRs and PEs inside the chip. Flow control between the I/O cell and the DMR prevents data loss or duplication; however, a data jam may result if a slowed I/O cell is sent data at a higher rate than it can process.

While the input of a shared clock reference signal (CLKREF) to the PLLs of the two chips provides CLK1 phase stability and phase stability between the SYNC signals of the two chips, the sync generators of both chips' CNT0 counter would have to come out of reset on the exact same cycle of CLK1 for the SYNC signals of the two chips to be exactly aligned. If one reset signal is delayed (or "skewed") relative to the other by as little as a half cycle of CLK1, then the two CNT0 counters may lock-in a full CLK1 cycle of skew between the SYNC signals, which erodes timing margins for signals between the chips. In general, a skew of the reset signals by an interval t will result in a skew of n cycles of CLK1 in the SYNC signals, where n=t/tper rounded to the nearest integer value n, and tper is the period of CLK1. Therefore, a new approach is desired.

SUMMARY OF THE EMBODIMENTS

Various embodiments of methods and circuits are disclosed, in which clock and select signals may be distributed throughout a synchronous digital system.

In one embodiment, a method is disclosed for reconfiguring clock generation circuitry in a clock distribution network of a synchronous digital system. A first clock signal may be generated and selected as a primary clock. A second clock signal may then replace the first clock as the primary clock, without causing clock-induced errors in the synchronous digital system. The clock generation circuitry may then be reconfigured during the time that the second clock signal is acting as the primary clock. The first clock signal may then be selected again as the primary clock, after the clock generation circuitry has stabilized, without causing clock-induced errors in the synchronous digital system.

In some embodiments, the second clock signal may be an external clock signal. In other embodiments, in which the synchronous digital system is comprised on a chip, the second clock signal may generated by an on-chip oscillator that is independent of external clock signals. In such embodiments, condition may be detected requiring selection of a clock signal generated on-chip as the primary clock. The second clock signal may then be selected in response to the detecting. In some embodiments, the condition requiring selection of a clock signal generated on-chip may comprise a signal indicating possible tampering with the synchronous digital system.

In some embodiments, the reconfiguring the clock generation circuitry may comprise changing at least one setting of the clock generation circuitry such that the clock generation circuitry dissipates power at a different rate. In some embodiments, the reconfiguring may comprise powering down the clock generation circuitry to place the clock generation circuitry in an off state, and later powering up the clock generation circuitry to return the clock generation circuitry to an on state. In other embodiments, the reconfiguring may comprise removing a clock input from the clock generation circuitry, and later replacing the clock input to the clock generation circuitry. In yet other embodiments, the reconfiguring may comprise changing a target frequency of the clock generation circuitry.

In some embodiments, the clock generation circuitry may be determined to have stabilized after the reconfiguring the clock generation circuitry. Selecting the first clock signal as the primary clock after the clock generation circuitry has stabilized may be performed at least in part in response to the determining.

In some embodiments, the clock generation circuitry may comprise a phase-locked loop (PLL). Determining that the clock generation circuitry has stabilized may comprise determining that the PLL has achieved phase lock.

In some embodiments, a predetermined time may be allowed to pass after the reconfiguring the clock generation circuitry. Selecting the first clock signal as the primary clock after the clock generation circuitry has stabilized may be performed after waiting the predetermined time.

In one embodiment, a synchronous digital system is disclosed. Clock generation circuitry of the synchronous digital system may be configured to generate a first clock signal based at least in part on a received external clock signal, and to programmatically receive configuration settings. Clock signal selector circuitry of the synchronous digital system may be configured to programmatically select between a plurality of clock signals for use as a primary clock signal without causing clock-induced errors in the synchronous digital system. The plurality of clock signals may comprise the first clock signal and the external clock signal. Synchronous digital logic of the synchronous digital system, configured to operate using the primary clock signal, may be configured to cause the clock signal selector circuitry to select the first clock signal. The synchronous digital logic may then cause the clock signal selector circuitry to select one of the plurality of clock signals other than the first clock signal after the selecting the first clock signal. The synchronous digital logic may then reconfigure the clock generation circuitry. The synchronous digital logic may then cause the clock signal selector circuitry to select the first clock signal after the clock generation circuitry has stabilized following the reconfiguring the clock generation circuitry.

In some embodiments, in reconfiguring the clock generation circuitry, the synchronous digital logic may be configured to change at least one setting of the clock generation circuitry such that the clock generation circuitry dissipates power at a different rate. In some embodiments, the synchronous digital logic may power down the clock generation circuitry to place the clock generation circuitry in an off state, and later power up the clock generation circuitry to return the clock generation circuitry to an on state. In other embodiments, the synchronous digital logic may remove the external clock signal from the clock generation circuitry, and later replace the external clock signal to the clock generation circuitry. In other embodiments, the synchronous digital logic may change a target frequency of the clock generation circuitry.

In some embodiments, the synchronous digital logic is configured to determine that the clock generation circuitry has stabilized after the clock generation circuitry has been reconfigured. Causing the clock signal selector circuitry to select the first clock signal after the clock generation circuitry has stabilized may be at least in part in response to the determining. In some embodiments, the clock generation circuitry may comprise a phase-locked loop (PLL). In determining that the clock generation circuitry has stabilized, the synchronous digital logic may be configured to determine that the PLL has achieved phase lock. In other embodiments, the synchronous digital logic is configured to wait a predetermined time after the reconfiguring the clock generation circuitry. The causing the clock signal selector circuitry to select the first clock signal after the clock generation circuitry has stabilized may be performed after waiting the predetermined time.

In some embodiments, in which the synchronous digital system is comprised on a chip, an on-chip clock signal generator may be configured to generate a second clock signal independent of the external clock signal. The plurality of clock signals may further comprise the second clock signal. In some embodiments the on-chip clock signal generator comprises a ring oscillator. In some embodiments, the clock signal selector circuitry may be configured to select the second clock signal in response to a condition requiring selection of a clock signal generated on-chip as the primary clock. In some embodiments, the condition may comprise a signal indicating possible tampering with the synchronous digital system.

In one embodiment, a synchronous digital system comprised on a chip is disclosed. Synchronous digital logic of the synchronous digital system may be configured to operate using a primary clock signal. An on-chip clock signal generator of the synchronous digital system may be configured to generate a first clock signal independent of an external clock signal received by the synchronous digital system. Clock signal selector circuitry of the synchronous digital system may be configured to select between a plurality of clock signals for use as the primary clock signal. The plurality of clock signals may comprise the first clock signal and a signal dependent on the external clock signal. The clock signal selector circuitry may be further configured to select between the plurality of clock signals based at least in part on the contents of a software-configurable register when a clock selection override signal indicates normal operation. When the clock selection override signal indicates a condition requiring selection of a clock signal generated on-chip for use as the primary clock signal, the clock signal selector circuitry may select the first clock signal.

In some embodiments, the clock selection override signal may comprise a tamper detection signal. The clock selection override signal indicating a condition requiring selection of a clock signal generated on-chip for use as the primary clock signal may comprise the tamper detection signal indicating possible tampering with the synchronous digital system. In some embodiments, in response to the tamper detection signal, the synchronous digital logic may be configured to perform security measures requiring a continuing clock signal. Selecting the first clock signal may thus enable the security measures to be performed regardless of whether the external clock signal is stopped. In some embodiments, the security measures may comprise clearing state information of the synchronous digital logic.

In some embodiments, the clock selection override signal comprises a clock-loss signal. The clock selection override signal indicating a condition requiring selection of a clock signal generated on-chip for use as the primary clock signal comprises the clock-loss signal indicating that loss of the external clock signal is anticipated.

In some embodiments, the on-chip clock signal generator may comprise a ring oscillator.

In some embodiments, the clock signal selector circuitry may be configured to programmatically select between the plurality of clock signals without causing clock-induced errors in the synchronous digital system.

In one embodiment, a method of avoiding clock signal errors in a synchronous digital system comprised on a chip is disclosed. A first clock signal may be provided as a primary clock for the synchronous digital system. The first clock signal may be dependent upon an external clock signal received by the synchronous digital system. A clock selection override signal may be received, which indicates a condition requiring selection of a clock signal generated on-chip for use as the primary clock. In response to the receiving, a second clock signal may be selected as the primary clock. The second clock signal may be generated by an on-chip clock signal generator independent of the external clock signal.

In some embodiments, receiving the clock selection override signal may comprise receiving a tamper detection signal indicating possible tampering with the synchronous digital system. In some embodiments, in response to the tamper detection signal, security measures may be performed, which require a continuing clock signal. Selecting the first clock signal may thus enable the security measures to be performed regardless of whether the external clock signal is stopped. In some embodiments, performing the security measures may comprise executing steps to clear state information of the synchronous digital system. The second clock signal may be used as the primary clock during while the steps are executed. In other embodiments, receiving the clock selection override signal may comprise receiving a signal indicating that loss of the external clock signal is anticipated.

In some embodiments, the on-chip clock signal generator may comprise a ring oscillator.

In some embodiments, selecting the second clock signal as the primary clock is performed without causing clock-induced errors in the synchronous digital system.

In one embodiment, an apparatus is disclosed. A reference clock generator of the apparatus may be configured to generate a reference clock signal. A plurality of integrated circuit chips of the apparatus may each comprise an input port coupled to the reference clock generator. The input port may be configured to receive the reference clock signal. Each chip may also comprise clock generation circuitry configured to generate a primary clock signal dependent upon the reference clock signal. Each chip may also comprise synchronizing signal generation circuitry configured to generate a synchronizing signal that is edge-aligned to the primary clock signal and phase-aligned to the reference clock signal. The respective synchronizing signals of the plurality of chips are phase-aligned as a result of their common phase-alignment to the reference clock signal. Each chip may also comprise clock divider circuitry configured to receive the primary clock signal and the synchronizing signal. The clock divider circuitry of each chip may generate a frequency-divided clock signal having a frequency that is less than a frequency of the primary clock signal. The frequency-divided clock signal may be phase-aligned to the synchronizing signal. Each chip may also comprise input/output (I/O) circuitry configured to receive as a clock input the frequency-divided clock signal. The I/O circuitry of each chip may communicate with the respective I/O circuitry of another chip of the plurality of chips. The frequency of the frequency-divided clock signal of one chip is the same as the respective frequency of the frequency-divided clock signal of the other chip, and the frequency-divided clock signal of one chip is phase-aligned with the respective frequency-divided clock signal of the other chip.

In some embodiments, for each chip, the clock generation circuitry may comprise a phase-locked loop (PLL) configured to receive the reference clock signal and generate a high frequency clock signal that has a frequency much higher than the frequency of the reference clock signal.

In some embodiments, the I/O circuitry of each chip may comprise a plurality of I/O cells. Each chip may further comprise a clock and synchronization signal distribution network. The distribution network of each chip may comprise a feed point configured to receive the primary clock signal. The distribution network of each chip may also comprise fan-out circuitry connected to the feed point. The fan-out circuitry may be configured to propagate the primary clock signal from the feed point to the I/O circuitry, such that the primary clock signal has uniform delay between the feed point and each I/O cell of the plurality of I/O cells. The distribution network of each chip may also comprise a plurality of regenerators positioned throughout the fan-out circuitry.

In some such embodiments, the clock generation circuitry of each chip may comprise a PLL. Each PLL may be configured to receive the reference clock signal, generate a high frequency clock signal output, and receive a feedback signal that is a delayed copy of the high frequency clock signal. The feedback signal is phase-locked to the reference clock signal. The clock generation circuitry of each chip may also comprise a feedback path for the PLL. The feedback path may parallel the primary clock through the clock and synchronization signal distribution network from the high-frequency clock output to a regenerator that serves one of the I/O cells that is located the near the PLL. The feedback path is provided to a feedback input of the PLL.

In some embodiments, the synchronizing signal generation circuitry of each chip may comprise an edge detector configured to detect a clock edge of the reference clock signal, and a counter. Each counter may be configured to update a count value based on the primary clock signal, reset the count value based on the output of the edge detector, and output a pulse of the synchronizing signal when the count value is equal to a specific value.

In some embodiments, the propagation delay of the reference clock signal between the reference clock generator and a first chip of the plurality of chips is approximately equal to the propagation delay between the reference clock generator and a second chip of the plurality of chips. Clock skew is thus minimized between the reference clock signal received by the first chip and the reference clock signal received by the second chip.

In some embodiments, the propagation delay of the respective primary clock signal between the clock generation circuitry of a first chip of the plurality of chips and the clock divider circuitry of the first chip is approximately equal to the propagation delay of the respective primary clock signal between the clock generation circuitry of a second chip of the plurality of chips and the clock divider circuitry of the second chip.

In one embodiment, a method for synchronizing digital communications between a first chip and a second chip is disclosed. An external reference clock signal may be received at each chip. Each chip may then generate a respective high frequency clock signal having a frequency that is a configurable multiple of a frequency of the reference clock. Each chip may then generate a respective synchronizing signal dependent upon the external reference clock signal. The respective synchronizing signals of the first chip and the second chip are phase-aligned as a result of their common dependence upon the external reference clock signal. Each chip may distribute, to a respective synchronous digital system comprised on the chip, a respective primary clock signal dependent upon the respective high frequency clock signal. The primary clock signal at each of a respective plurality of I/O cells of the chip may be uniformly delayed with respect to the respective high frequency clock signal. Each chip may frequency-divide the respective primary clock signal to generate a respective frequency-divided clock signal having a frequency that is less than a frequency of the respective primary clock signal. The frequency-dividing may use the respective synchronizing signal such that the respective frequency-divided clock signals of the first chip and the second chip are edge-aligned. Digital communication may be performed between a first I/O cell of the first chip and a second I/O cell of the second chip, wherein the first I/O cell uses as a clock input the frequency-divided clock signal of the first chip, and the second I/O cell uses as a clock input the frequency-divided clock signal of the second chip.

In some embodiments, generating the respective synchronizing signal comprises determining an edge of the external reference clock signal, and generating a pulse of the synchronization signal in response to determining the edge of the external reference clock signal. In some embodiments, generating the pulse of the synchronization signal may comprise resetting a counter configured to output a pulse upon reaching a specific counter value. The counter may use as a clock input the primary clock signal.

In some embodiments, generating the respective high frequency clock signal may comprise outputting a high frequency clock signal from a phase-locked loop (PLL). In some embodiments, generating the respective high frequency clock signal may further comprise providing to the PLL a feedback signal. The path of the feedback signal may parallel the path of the primary clock signal from a feed point to an I/O cell of the chip.

Figure 1:
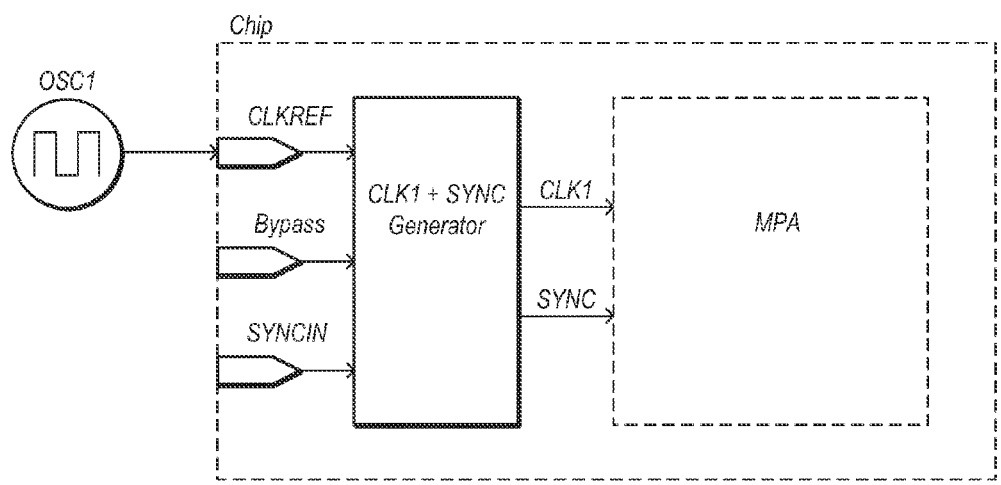
FIG. 1 is a block diagram illustrating an embodiment of a prior art system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Flowchart diagrams are provided to illustrate exemplary embodiments, and are not intended to limit the disclosure to the particular steps illustrated. In various embodiments, some of the method elements shown may be performed concurrently, performed in a different order than shown, or omitted. Additional method elements may also be performed as desired.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

Incorporation by Reference

U.S. Pat. No. 7,415,594 titled "Processing System With Interspersed Stall Propagating Processors And Communication Elements" whose inventors are Michael B. Doerr, William H. Hallidy, David A. Gibson, and Craig M. Chase is hereby incorporated by reference in its entirety as though fully and completely set forth herein.

U.S. patent application Ser. No. 13/274,138, titled "Disabling Communication in a Multiprocessor System", filed Oct. 14, 2011, whose inventors are Michael B. Doerr, Carl S. Dobbs, Michael B. Solka, Michael R Trocino, and David A. Gibson is hereby incorporated by reference in its entirety as though fully and completely set forth herein.

Terms

Hardware Configuration Program—a program consisting of source text that can be compiled into a binary image that can be used to program or configure hardware, such as an integrated circuit, for example.

Computer System—any of various types of computing or processing systems, including a personal computer system (PC), mainframe computer system, workstation, network appliance, internet appliance, personal digital assistant (PDA), grid computing system, or other device or combinations of devices. In general, the term "computer system" can be broadly defined to encompass any device (or combination of devices) having at least one processor that executes instructions from a memory medium.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Exemplary Synchronous Digital System

Figure 6:
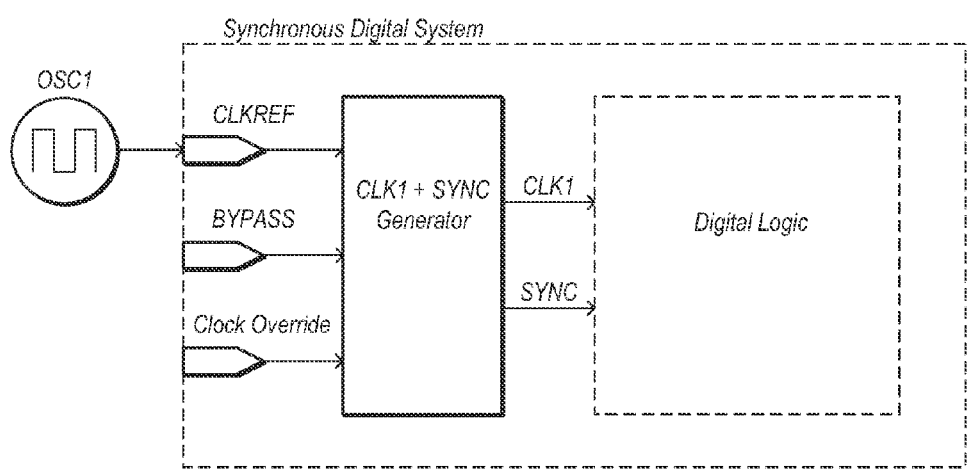
FIG. 6 is a block diagram illustrating an embodiment of a synchronous digital system.

FIG. 6 illustrates an embodiment of a synchronous digital system, comprising a clock distribution network. Although the embodiment of Figure is illustrated as being comprised on a chip, other embodiments may comprise multiple chips and additional components. Alternatively, multiple synchronous digital systems may be comprised on a single chip. Although the disclosed system is referred to as a synchronous digital system, certain components of the system may operate in a non-synchronous manner. For example, the synchronous digital system may comprise a ring oscillator that operates asynchronously with the remainder of the system. Similarly, the system may comprise analog components. Referring to the system as "a digital synchronous system" is meant to suggest only that at least a substantial portion of the system comprises digital logic that operates based on a common clock or a plurality of related clocks.

As illustrated in FIG. 6, the synchronous digital system comprises a section of digital logic. In some embodiments, the digital logic may comprise a multi-processor array (MPA). The digital logic receives as inputs a clock signal CLK1 and a synchronizing signal SYNC. The CLK1 and SYNC signals are generated by a CLK1+SYNC Generator. The CLK1+SYNC Generator receives as inputs a clock reference signal CLKREF, a clock bypass signal Bypass, and a signal Clock Override. Numerous other inputs are possible in other embodiments. As illustrated in FIG. 6, the inputs are shown as provided to the CLK1+SYNC Generator from input pins of the chip. However, in other embodiments, these signals may be generated on-chip. Clock reference signal CLKREF is a system reference clock that may be used to synchronize operations between different chips, and is therefore illustrated in the embodiment of FIG. 6 as being generated by an oscillator OSC1 outside of the synchronous digital system.

Figure 7:
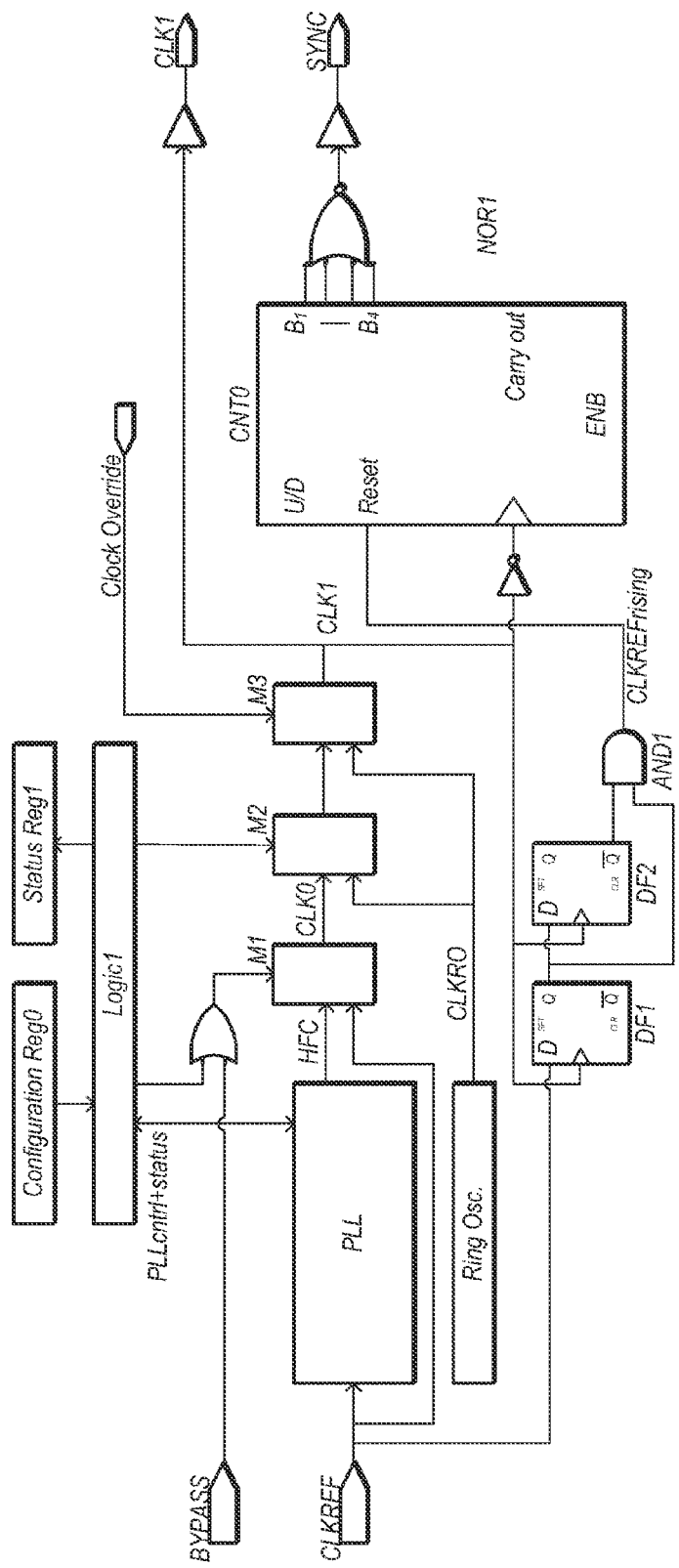
FIG. 7 is a block diagram of an embodiment of clock and sync signal generator.

FIG. 7 illustrates an embodiment of the CLK1+SYNC Generator in greater detail. As illustrated, the CLK1+SYNC Generator takes CLKREF, BYPASS, and Clock Override signals as inputs, and provides CLK1 and SYNC signals as outputs. The CLK1+SYNC Generator also comprises registers Configuration Reg0, which may receive data from software, and Status Reg1, which may store status information to be retrieved by software. Such status information may include, for example, the PLL lock status signal and loss of clock input signals.

In FIG. 7, the CLK1 generator portion is composed of a phase-locked loop (PLL), a ring oscillator, three multiplexers, some logic, a configuration register, and a status register.

Input signal CLKREF is provided to the PLL, which provides as an output the system's highest frequency clock signal (HFC). The PLL of FIG. 7 may comprise various configurable clock dividers, selection logic, and other components known in the art for configuring a clock signal. In other embodiments, the PLL may be replaced with a digital phased-locked loop (DPLL), a delay-locked loop (DLL), or other clock generation circuitry.

Input signal CLKREF and clock signal HFC are both provided as inputs to multiplexer M1, which may be controlled by input signal BYPASS, and by signals from logic block Logic1, which receives inputs from Configuration Reg0 and the PLL. Multiplexer M1 outputs clock signal CLK0.

The ring oscillator Ring Osc. provides as an output a clock signal CLKRO, which is not dependent upon CLKREF or any other clock signal received by the synchronous digital system. Clock signals CLK0 and CLKRO are provided as inputs to multiplexer M2, which may be controlled by signals from logic block Logic1.

Clock signal CLKRO and the output clock signal of multiplexer M2 are provided as inputs to multiplexer M3, which may be controlled by input signal Clock Override. Multiplexer M3 outputs the output clock signal CLK1, which may be buffered before leaving the CLK1+SYNC Generator.

In some embodiments, additional clock dividers or other circuitry may be interspersed between and/or after multiplexers M1-M3.

In FIG. 7, the SYNC generator portion is composed of data flip-flops (DF1, DF2), a counter (CNT0), and some logic gates. Clock signal CLK1 is provided to an inverter, and the inverted clock signal is provided as a Clock input to counter CNT0. The multiple outputs of counter CNT0 are fed into a logical "nor" gate, which provides output synchronizing signal SYNC. Thus, as illustrated, SYNC is high only when all outputs of CNT0 are low; i.e. when the count of CNT0 is zero. However, in other embodiments the outputs of CNT0 may be further configured before being provided to NOR1, as known in the art, such that SYNC is high when the outputs of CNT0 correspond to other values. Although CNT0 is depicted as a four-bit counter, other embodiments may utilize counters of other sizes, or of variable size. Output signal SYNC may be buffered before leaving the CLK1+SYNC Generator.

Input signal CLKREF is provided to an edge detector, which is illustrated as a rising-edge detector comprising DF1 and DF2, which are clocked by CLK1, and a logical "and" gate AND1. In other embodiments, other edge detectors may be used, including falling-edge detectors, as long as all chips that need to communicate synchronously at reduced rates use the same edge. The output of the edge detector is signal CLKREFrising, which is provided to the Reset input of counter CNT0.

The functioning of the CLK1+SYNC Generator will be more fully explained with reference to FIGS. 8-18.

De-Glitched Clock Signal Selection

As illustrated in FIG. 7, Multiplexers M1-M3 allow selection of various clock signals for use as clock signal CLK1. Multiplexers M1-M2 are software configurable to select clock signal source from reference clock signal CLKREF, clock signal HFC from the PLL, or clock signal CLKRO from the on-chip ring oscillator Ring Osc. When a multiplexer is switched from one source to another, it may introduce distortions and noise to its output signal that may cause malfunction of downstream circuits. Glitches in the head end of the clock distribution can propagate all over the chip and out to I/O cells and cause a functional error anywhere along the way. Glitches are also undesirable because they reduce timing margins. In the prior art, the selection of a new clock signal source is typically followed by a reset of downstream circuits which brings them to a known state for restart, removing any ill effects of glitches.

When switching clock signal sources "on the fly" from a first clock source to a second clock source that is not synchronous to the first one, there is the possibility that the multiplexer cuts off an input clock pulse and emits a short pulse or puts a notch in a longer pulse. These short pulses are collectively called glitches.

To eliminate the possibility of glitches in the output from multiplexers M1-M3, one or more of multiplexers M1-M3 may be augmented with de-glitch circuits.

Figure 8:
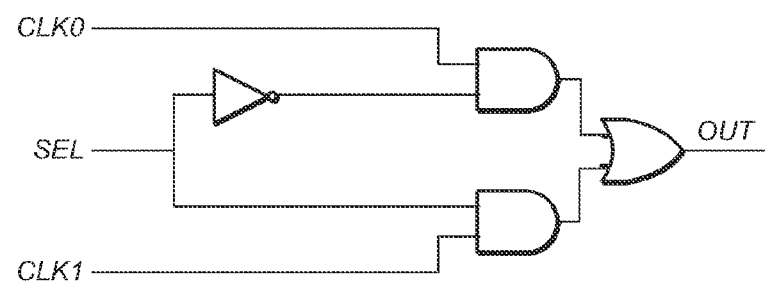
FIG. 8 is a block diagram of an embodiment of a simple 2-input multiplexer according to the prior art.
Figure 9:
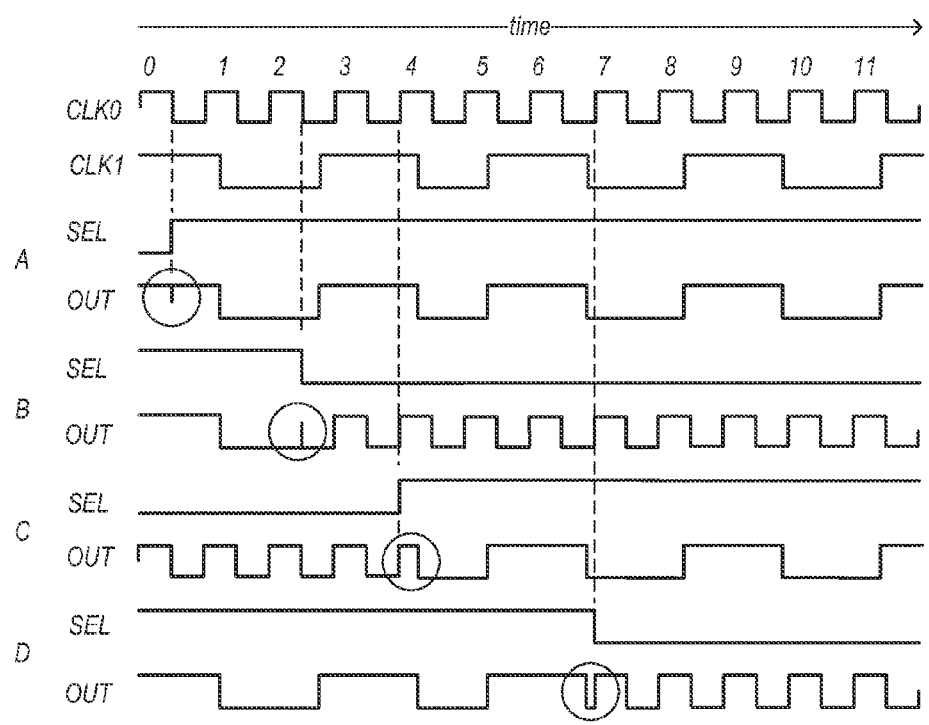
FIG. 9 depicts example waveforms resulting from operation of a multiplexer according to the prior art.

Traditional multiplexers are simple combinations of gates used to select from multiple signal inputs. The basic 2-input multiplexer (2-in mux) schematic diagram is shown in FIG. 8. Typical waveforms are shown in FIG. 9 for four cases in which the select input signal SEL changes. The waveforms of the clock signals CLK0 and CLK1 are merely examples and many other frequency or phase mismatches are possible. For each case shown, a glitch is observed on the OUT signal, and shown circled. As shown, small and large glitches are possible in either the high or low direction.

Figure 10:
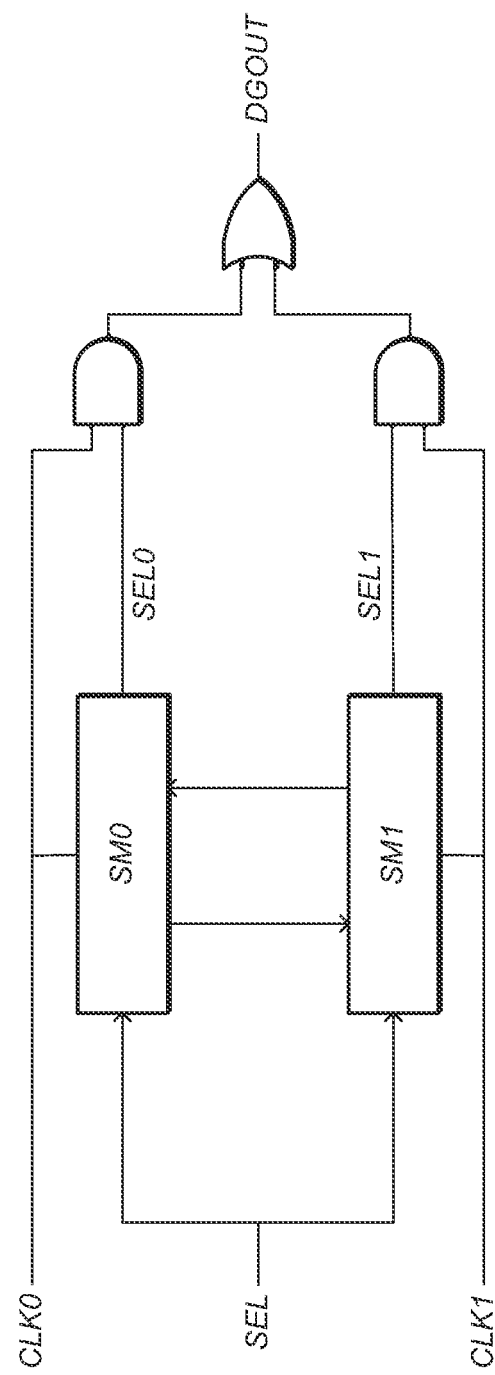
FIG. 10 is a block diagram of an embodiment of a simple 2-input multiplexer with de-glitch augmentation.

FIG. 10 illustrates one exemplary embodiment of a two-input multiplexer with de-glitch augmentation. The augmentation of this embodiment comprises a pair of state machines that may each accept inputs from the SEL, CLK0, and CLK1 inputs as well as from each other. However, one skilled in the art will recognize that other embodiments may utilize one or more state machines with functionality similar to that of the two state machines illustrated here.

Figure 11:
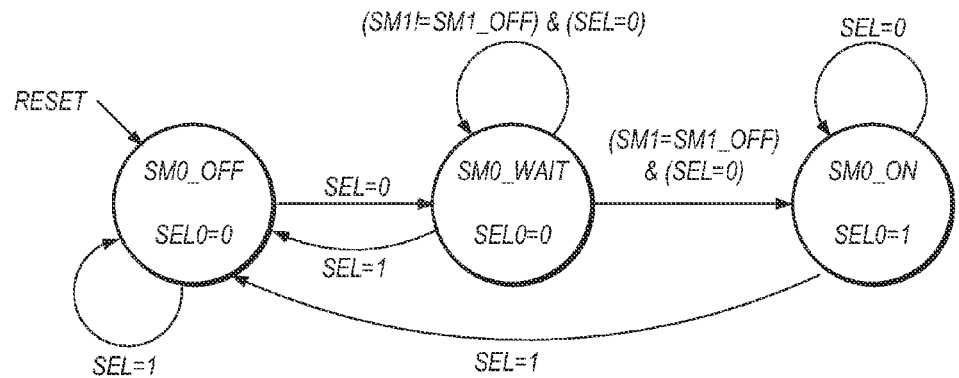
FIG. 11 illustrates a state diagram depicting operation of a state machine included in the multiplexer of FIG. 10.

The state diagram in FIG. 11 describes the operation of state machine SM0. At reset, SM0 is set to state SM0_OFF. In state SM0_OFF, select signal SEL0 is set to logical 0. Upon detecting that select signal SEL is set to logical 0, SM0 transitions to state SM0_WAIT. In state SM0_WAIT, SEL0 remains set to 0. If SEL changes to logical 1 while SM0 is in state SM0_WAIT, then SM0 transitions back to state SM0_OFF. If instead, while SM0 is in state SM0_WAIT, SM0 detects that SEL remains 0 and SM1 is in state SM1_OFF, then SM0 transitions to state SM0_ON. In state SM0_ON, SEL0 is set to 1. Upon detecting that SEL is 1, SM0 transitions back to state SM0_OFF.

Figure 12:
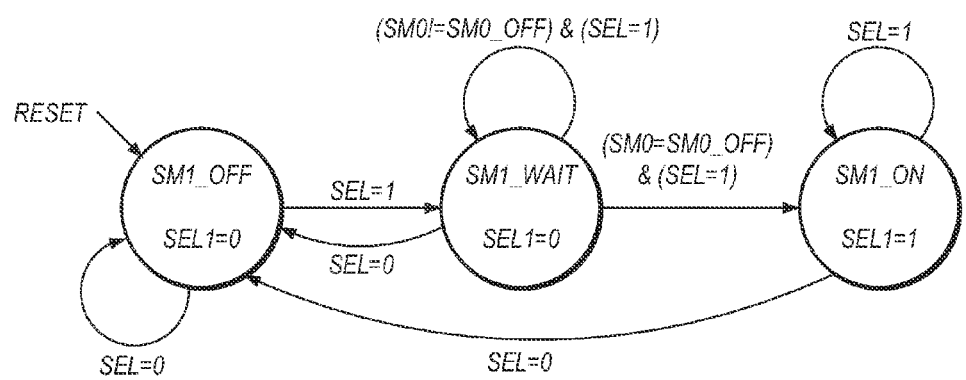
FIG. 12 illustrates a state diagram depicting operation of another state machine included in the multiplexer of FIG. 10.

The state diagram in FIG. 12 describes the operation of state machine SM1. At reset, SM1 is set to state SM1_OFF. In state SM1_OFF, select signal SEL1 is set to logical 0. Upon detecting that select signal SEL is set to logical 1, SM1 transitions to state SM1_WAIT. In state SM1_WAIT, SEL1 remains set to 0. If SEL changes to logical 0 while SM1 is in state SM1_WAIT, then SM1 transitions back to state SM1_OFF. If instead, while SM1 is in state SM1_WAIT, SM1 detects that SEL remains 1 and SM0 is in state SM0_OFF, then SM1 transitions to state SM1_ON. In state SM1_ON, SEL1 is set to 1. Upon detecting that SEL is 0, SM1 transitions back to state SM1_OFF.

Figure 13:
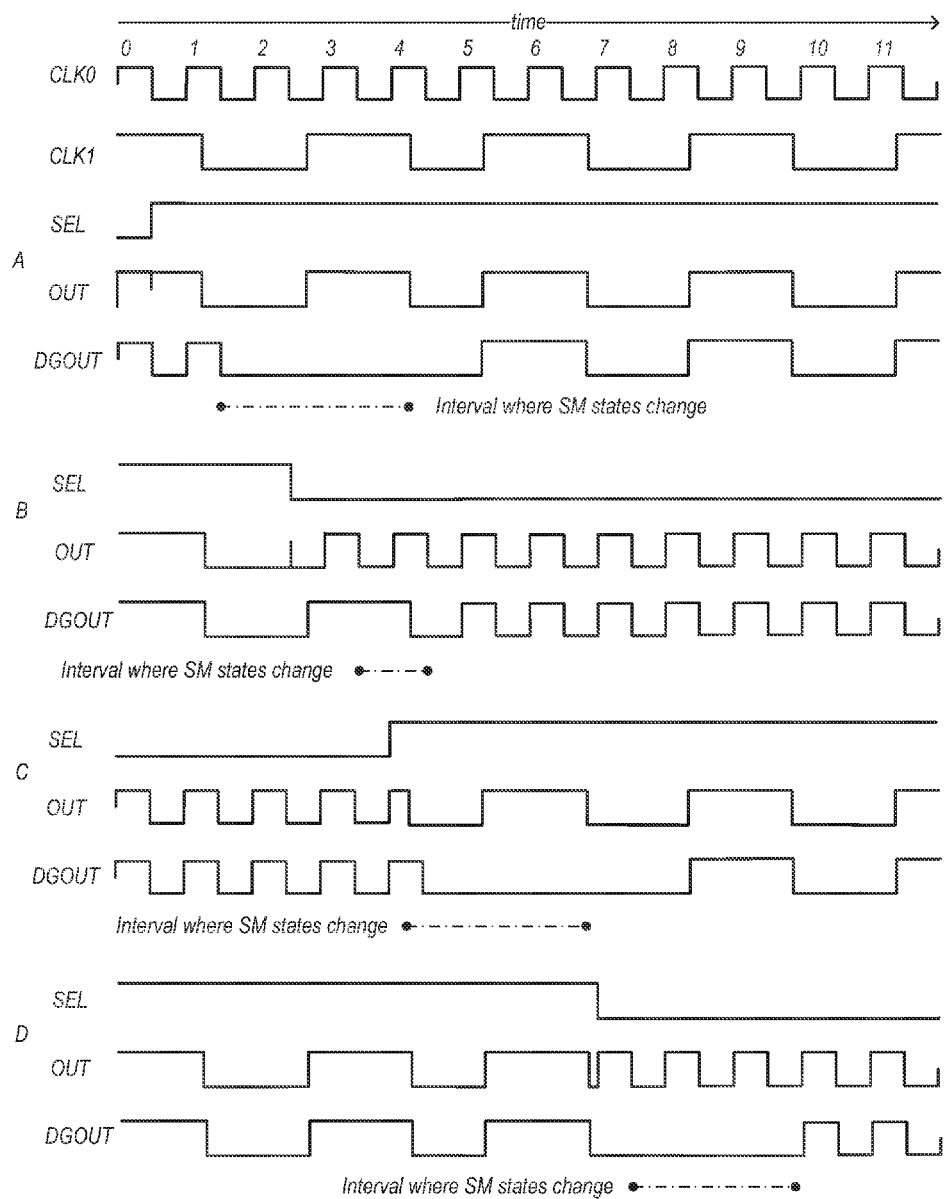
FIG. 13 depicts example waveforms resulting from operation of the multiplexer of FIG. 10.

FIG. 13 shows waveforms for the same four cases shown in FIG. 9, and adds the output signal DGOUT of the de-gliched multiplexer of FIG. 10. The waveforms of FIG. 13 assume that state machine SM0 samples its inputs on the falling edge of clock signal CLK0, and SM1 samples its inputs on the falling edge of clock signal CLK1. As shown in FIG. 13, the de-glitch augmentation prevents short pulses in various combinations of phase and frequency differences between the CLK0 and CLK1 inputs.

By utilizing multiplexers with de-glitch augmentation as one or more of multiplexers M1-M3 of FIG. 7, the clock signal selected for use as CLK1 may be switched "on the fly" without causing clock-induced errors downstream in the synchronous digital system.

Reconfiguring Clock Generation Circuitry

In systems such as the exemplary embodiment of FIG. 7, it may be advantageous to reconfigure the PLL, or similar clock generation circuitry, dynamically, such as via software controls. For example, the frequency of PLL output HFC may be temporarily reduced via software instructions to save power when the synchronous digital system is not being fully utilized. Alternatively, a source of the input reference signal CLKREF may be switched, causing loss of phase lock within the PLL. In such cases, the PLL may produce glitches, and will take some time to stabilize.

During this interval, an appropriate alternative clock signal may be selected for use as the primary clock signal provided to the synchronous digital system, to allow continued operation of downstream circuits. However, care should be taken to ensure that switching between clock signals does not introduce additional glitches on the primary clock signal.

Figure 14:
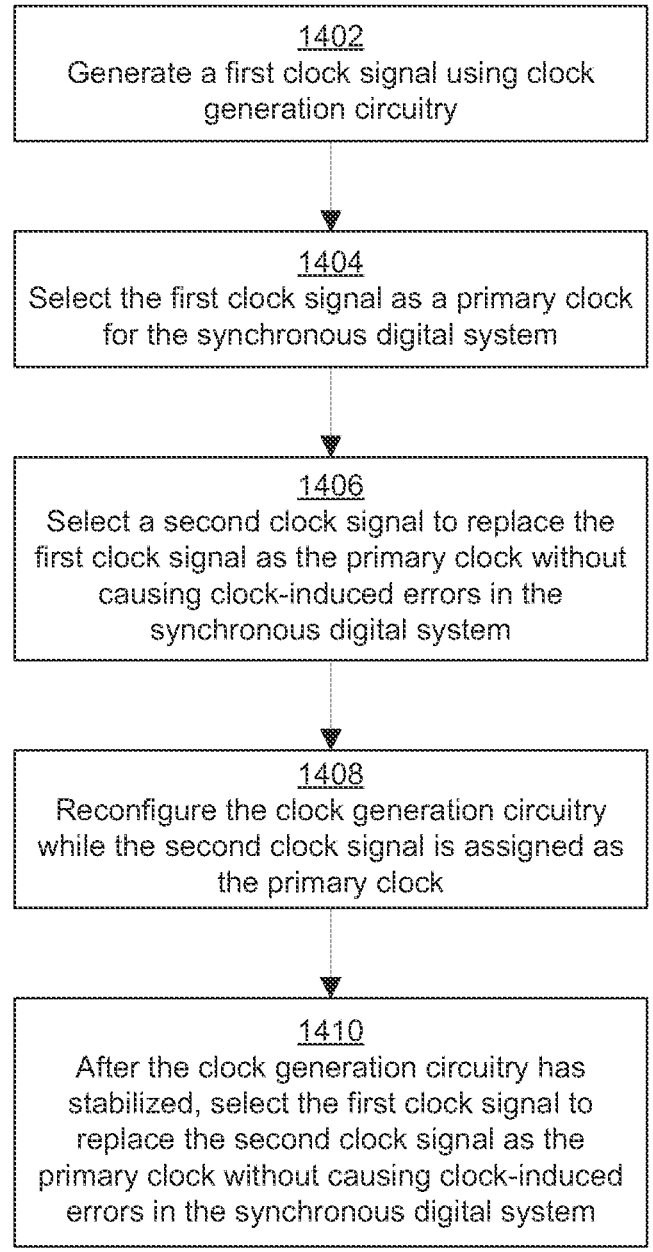
FIG. 14 is a flowchart diagram illustrating an embodiment of a method for reconfiguring clock generation circuitry without introducing clock-induced errors in the downstream circuitry.

FIG. 14 is a flowchart diagram illustrating an embodiment of a method for reconfiguring clock generation circuitry without introducing clock-induced errors in the downstream circuitry. The method shown in FIG. 14 may be used in conjunction with the exemplary systems of FIGS. 6-7, among other systems.

In step 1402, a first clock signal may be generated using clock generation circuitry. As illustrated in the exemplary embodiment of FIG. 7, the clock generation circuitry may comprise a PLL, and the first clock signal may be clock signal HFC. Other non-limiting examples of clock generation circuitry may include a DPLL or a DLL. Alternatively, the clock generation circuitry may comprise a ring oscillator, such as Ring Osc. of FIG. 7.

In step 1404, the first clock signal may be selected as a primary clock for the synchronous digital system. In the exemplary embodiments of FIGS. 6-7, the primary clock for the synchronous digital system is labeled as CLK1. In some embodiments, the first clock signal may be used as the primary clock for the synchronous digital system during normal operations.

In the exemplary embodiment of FIG. 7, selection of the first clock signal as the primary clock signal may be performed via multiplexers M1-M3. Multiplexers M1 and M2 may be controlled based on software configuration via register Configuration Reg0 and logic block Logic1. This allows software control over selection of the primary clock. Thus, in some embodiments, step 1404 may be performed in response to a software command. Alternatively, selection of the first clock signal as the primary clock may be automatic. Multiplexer M1 may also be controlled based on input signal BYPASS. Multiplexer M3 may be controlled based on input signal Clock Override, which is discussed in greater detail below.

In this context, selecting a clock signal "as" the primary clock for the synchronous system indicates that the circuitry of the system propagates the specified clock signal to at least a substantial portion of the synchronous digital system. This is intended to encompass embodiments in which the selected clock signal may pass through selection circuitry, buffers, and other circuitry. For example, in the embodiment of FIG. 7, clock signal HFC is selected as the primary clock for the synchronous digital system where multiplexer M1 is configured to select HFC, multiplexer M2 is configured to select CLK0, and multiplexer M3 is configured to select the output of multiplexer M2. This is also intended to encompass embodiments in which the primary clock is provided to local clock regenerator circuits, each of which may deliver to local logic elements a local clock signal that is a frequency- and/or skew-adjusted version of the primary clock.

In step 1406, a second clock signal may be selected as the primary clock. The second clock thus replaces the first clock as the primary clock. In order to prevent introduction of glitches on the primary clock signal, the selection may be performed using one or more multiplexers including de-glitch augmentation, such as the multiplexer of FIGS. 10-12. Other de-glitched multiplexers known in the art may alternatively be used.

In the exemplary embodiment of FIG. 7, selection of the second clock signal as the primary clock signal may be performed via multiplexers M1-M3. For example, the second clock signal may be clock reference signal CLKREF or clock signal CLKRO. In some embodiments, step 1406 may be performed in response to a software command. Alternatively, selection of the second clock signal as the primary clock may be automatic. For example, in one embodiment, logic block Logic1 may automatically configure multiplexer M1 to switch from selecting HFC to selecting CLKREF in response to register Configuration Reg0 receiving a command to reconfigure the PLL.

In step 1408, the clock generation circuitry may be reconfigured during the time that the second clock signal is acting as the primary clock. Because the first clock signal is not acting as the primary clock, any glitches that occur on the first clock signal as a result of the reconfiguration of the clock generation circuitry do not affect the downstream circuitry of the synchronous digital system.

In one embodiment, reconfiguring the clock generation circuitry may comprise changing at least one setting of the clock generation circuitry such that the clock generation circuitry dissipates power at a different rate. For example, the clock generation circuitry may be reconfigured to operate at a lower frequency, so as to dissipate less power, when the synchronous digital system is not being fully utilized. The clock generation circuitry may later be reconfigured again, through another iteration of the method of FIG. 14, to operate at a higher frequency, when the utilization of the synchronous digital system increases. In one embodiment, reconfiguring the clock generation circuitry may comprise powering down the clock generation circuitry to prevent operation, and then powering up the clock generation circuitry at a later time. Similarly, in another embodiment, reconfiguring the clock generation circuitry may comprise removing a clock signal input to the clock generation circuitry to prevent operation, and then reasserting the clock signal input to the clock generation circuitry at a later time. In these embodiments, power may be saved through preventing operation of the clock generation circuitry in any of these ways. In some embodiments, such reconfiguration may be performed programmatically; i.e. via software controls.

In step 1410, the first clock may be selected again as the primary clock. In order to prevent introduction of glitches on the primary clock signal, the selection may be performed using one or more multiplexers including de-glitch augmentation, such as the multiplexer of FIGS. 10-12. Other de-glitched multiplexers known in the art may alternatively be used. After the clock generation circuitry is reconfigured, it may require some time to stabilize. Therefore, selecting the first clock again as the primary clock may be performed after the clock generation circuitry has stabilized. In this context, the term "stabilized" indicates that the output of the clock generation circuitry is sufficiently free of aberrations as to avoid clock-induced errors in the downstream circuitry.

In one embodiment, selecting the first clock after the clock generation circuitry has stabilized may comprise waiting for a predetermined amount of time to pass after the reconfiguration of the clock generation circuitry has been completed before selecting the first clock. The predetermined amount of time should be long enough to allow the clock generation circuitry to stabilize.

In another embodiment, selecting the first clock after the clock generation circuitry has stabilized may comprise determining whether the clock generation circuitry has stabilized, and selecting the first clock as the primary clock at least in part in response to the determining. For example, in the embodiment of FIG. 7, the PLL may provide a status signal indicating whether it has achieved phase lock after being reconfigured. In one embodiment, logic block Logic1 may automatically configure multiplexer M1 to select HFC in response to receiving the status signal from the PLL indicating that the PLL has achieved phase lock. In another embodiment, register Status Reg1 may store the status indicating that the PLL has achieved phase lock to be read by software. The software may then provide instruction via register Configuration Reg0 and logic block Logic1 for multiplexer M1 to select HFC at least partly in response to reading register Status Reg1.

Automatic Selection of On-Chip Oscillator

In some circumstances, it may be advantageous to automatically select as the primary clock a signal that is generated on the chip with the synchronous digital system, independent of any external clock signals. Specifically, there are various circumstances in which clock signal errors may be avoided in this manner.

Figure 15:
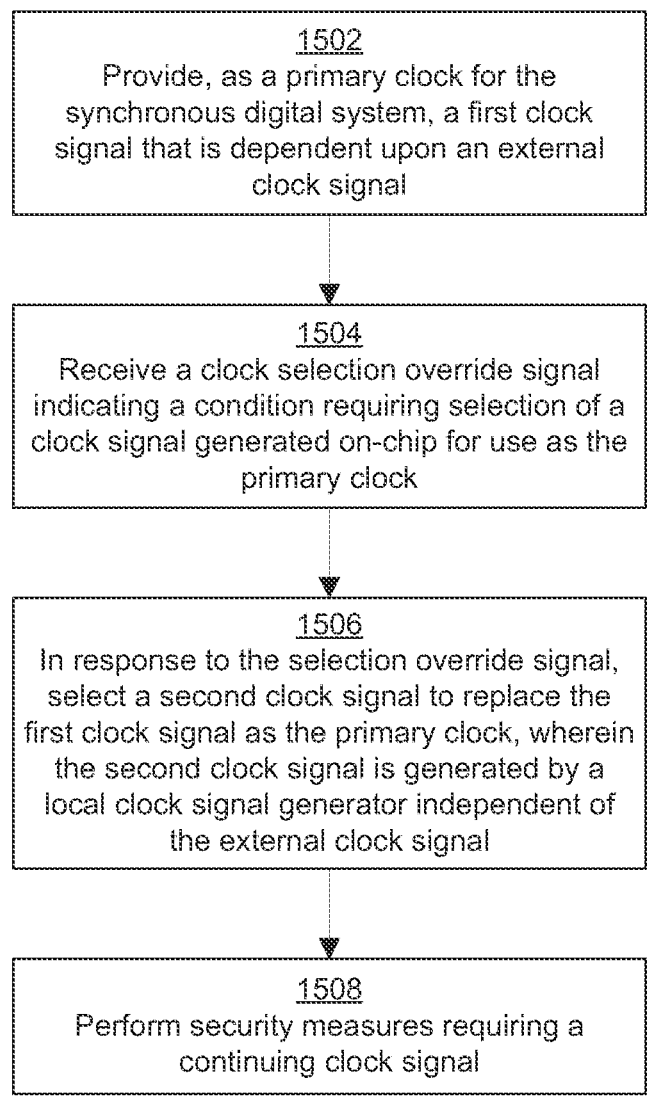
FIG. 15 is a flowchart diagram illustrating an embodiment of a method for avoiding clock signal errors in a synchronous digital system comprised on a chip.

FIG. 15 is a flowchart diagram illustrating an embodiment of a method for avoiding clock signal errors in a synchronous digital system comprised on a chip. The method shown in FIG. 15 may be used in conjunction with the exemplary systems of FIGS. 6-7, among other systems.

In step 1502, a first clock signal may be provided as a primary clock for the synchronous digital system. The first clock signal is dependent upon an external clock signal received by the synchronous digital system. As illustrated in the exemplary embodiment of FIG. 7, the first clock signal may be generated by a PLL, and the first clock signal may be clock signal HFC, which is dependent upon input clock reference signal CLKREF. In the exemplary embodiments of FIGS. 6-7, the primary clock for the synchronous digital system is labeled as CLK1.

During normal operation of the synchronous digital system, the primary clock may be selected from among a plurality of available clock signals, including the first clock signal. For example, in the embodiment of FIG. 7, CLK1 may be selected from among available clock signals HFC, CLKREF, and CLKRO using multiplexers M1 and M2. As discussed above, control of multiplexers M1 and M2 may be automatic or controlled by software.

In step 1504, a clock selection override signal may be received. The clock selection override signal may indicate a condition requiring selection of a clock signal generated on-chip for use as the primary clock. In the exemplary embodiment of FIG. 7, the clock selection override signal is illustrated as input signal Clock Override.

The clock selection override signal may indicate a variety of circumstances in various embodiments. For example, in one embodiment, the clock selection override signal may comprise a tamper-detection signal indicating possible or actual tampering with the synchronous digital system. Such tampering may include unauthorized access of either hardware or software of the synchronous digital system. The tamper-detection signal may comprise a signal from one or more sensors or other equipment configured to detect tampering. Such sensors or other equipment may or may not be comprised in the synchronous digital system, and may or may not be present on the chip. Examples of methods and equipment for detecting tampering may be found in U.S. patent application Ser. No. 13/274,138, which was incorporated by reference above.

In another embodiment, the clock selection override signal may comprise a clock-loss signal indicating that loss or instability of the external clock signal is anticipated. For example, the clock-loss signal may indicate that the source of input clock reference signal CLKREF has been, or is about to be, changed, reset, or otherwise interrupted.

In step 1506, a second clock signal may be selected as the primary clock in response to the selection override signal. The second clock thus replaces the first clock as the primary clock. The second clock signal is generated by an on-chip signal generator, independent of the external clock signal. Although the second clock signal is generated independent of any external clock signals, some embodiments may allow configuration of the on-chip signal generator via external configuration signals.

In the exemplary embodiment of FIG. 7, selection of the second clock signal as the primary clock signal may be performed via multiplexer M3. For example, the second clock signal may be clock signal CLKRO, generated by the ring oscillator Ring Osc. independent of input clock reference signal CLKREF. The selection of CLKRO in response to input signal Clock Override thus overrides other automatic or software-defined clock selections that may be defined through multiplexers M1-M2.

In order to prevent introduction of glitches on the primary clock, the selection may be performed using one or more multiplexers including de-glitch augmentation, such as the multiplexer of FIGS. 10-12. Other de-glitched multiplexers known in the art may alternatively be used. In other embodiments, de-glitch augmentation may not be necessary.

In step 1508, security measures may be performed that require a continuing clock signal. Such security measures may be appropriate in embodiments in which the clock selection override signal comprises a tamper-detection signal. For example, hackers or other persons intending to tamper with a chip may wish to read out status information of internal registers of the synchronous digital system. Various methods have been proposed to prevent the registers from being read, such as clearing the registers upon detection of external tampering. Therefore, to preserve the state of the internal registers, a hacker may stop the system reference clock (CLKREF), thus freezing operations within the internal registers of the synchronous digital system. Thus, in one embodiment, security measures, such as clearing state information of the synchronous digital system, may be performed in response to the tamper-detection signal. Because the second clock signal has been selected as the primary clock, security measures such as clearing the state information may proceed independent of whether CLKREF has stopped. Additional examples of possible security measures may be found in U.S. patent application Ser. No. 13/274,138, which was incorporated by reference above.

Inter-Chip Communication

Figure 16:
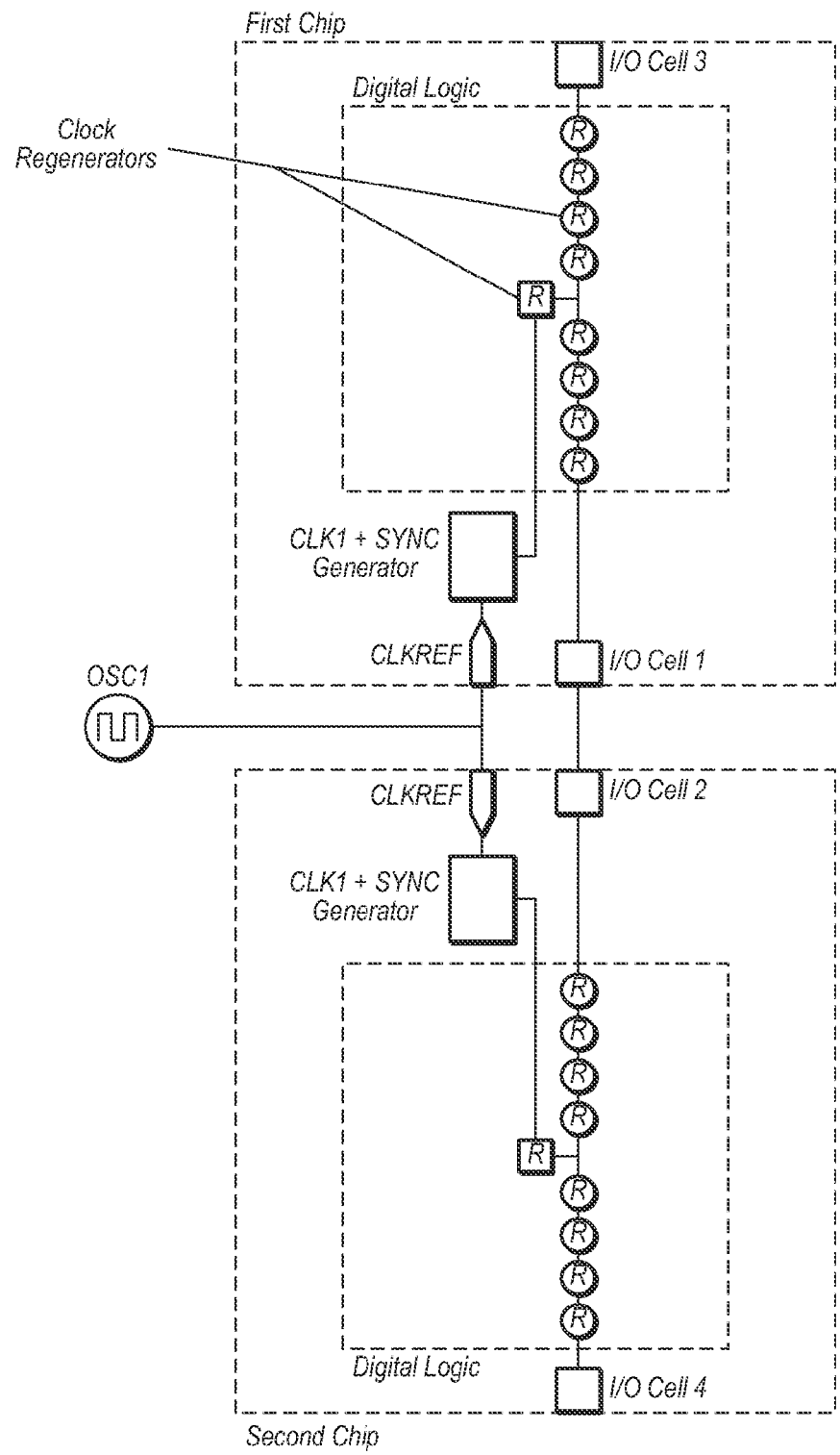
FIG. 16 is a block diagram illustrating input/output (I/O) communication between two integrated circuit (IC) chips.

FIG. 16 is a block diagram illustrating input/output (I/O) communication between two integrated circuit (IC) chips. As illustrated in FIG. 16, each of the First Chip and the Second Chip comprise a synchronous digital system such as the one illustrated in FIG. 6. For each chip, primary clock signal CLK1 is provided by the respective CLK1+SYNC Generator to a central clock regenerator of the digital logic block. The primary clock signal CLK1 may then pass through additional clock regenerators as it is propagated through a clock distribution network. An I/O cell may receive a clock signal from the last regenerator in a clock distribution branch.

In a multichip system, synchronous communication between chips may be achieved by sharing a common reference clock input signal and allowing PLLs on each chip to stabilize the phase relations between I/O circuits. This works well for un-divided clocks where a SYNC signal is not needed, and is illustrated in FIG. 17.

Figure 17:
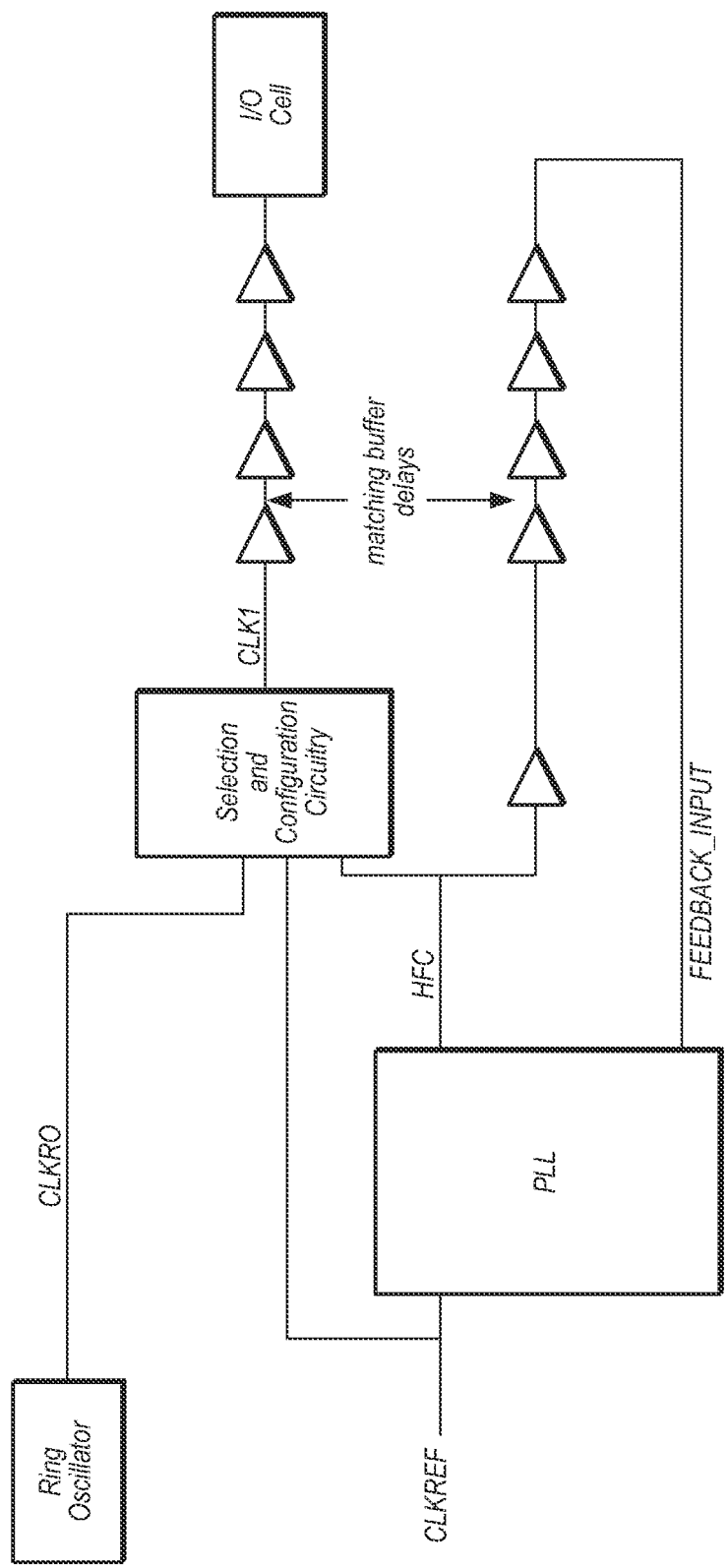
FIG. 17 is a block diagram illustrating an embodiment of a feedback path for the PLL of FIG. 7.

FIG. 17 is a block diagram illustrating an embodiment of a feedback path for the PLL of FIG. 7. The Ring Oscillator and PLL, as well as signals CLKREF, CLKRO, and HFC may correspond to the components and signals of the same names in FIG. 7. The Selection and Configuration Circuitry of FIG. 17 may correspond to the multiplexers M1-M3 of FIG. 7. In other embodiments, the Selection and Configuration Circuitry may include other circuitry.

The feedback path of FIG. 17 starts at the HFC output of the PLL, and parallels the primary clock through the distribution network to a regenerator that serves an I/O cell near the PLL. FIG. 16 illustrates an exemplary path of the primary clock to I/O Cell 1, which is near the CLK1+SYNC Generator, which may include a PLL. The feedback path of FIG. 17 includes buffer delays matching the buffer delays caused by the regenerators in the path of the primary clock through the distribution network. Propagation delays are also matched. The signal FEEDBACK_INPUT, which is a resulting delayed version of the high-frequency clock output occurring at the end of the feedback path, is provided to the PLL feedback input. This feedback has the effect of aligning the phase of the primary clock signal CLK1 at the I/O cell to the input clock reference signal CLKREF at the PLL. This minimizes the effect of regenerator delays and their variations with fabrication, supply voltage, and operating temperature on the phase of the primary clock signal at the I/O cells. Therefore, if the clock reference signal CLKREF received at the PLL of a first chip is edge-aligned to the clock reference signal CLKREF received at the PLL of a second chip, then the respective primary clock signal CLK1 at the I/O cell of the first chip will be edge-aligned to the respective primary clock signal CLK1 at the I/O cell of the second chip.

Data signals between chips may be delayed and distorted in many ways, and one of the simplest solutions to overcome these issues is to reduce the data rates, which also reduces power dissipation of each I/O circuit. In one embodiment, an I/O circuit may have an associated clock divider, such as the one shown in FIG. 3. Data rates may be reduced under program control in an I/O circuit by updating configuration register RegP for the clock divider for the I/O circuit. However, bringing the phase of the respective divided clocks of two chips into alignment to the nearest cycle of CLK1 requires the respective SYNC signals of the two chips to be distributed with CLK1 to the clock dividers for the I/O circuits, and further requires the respective SYNC signals to be synchronized between the chips.

Figure 5:
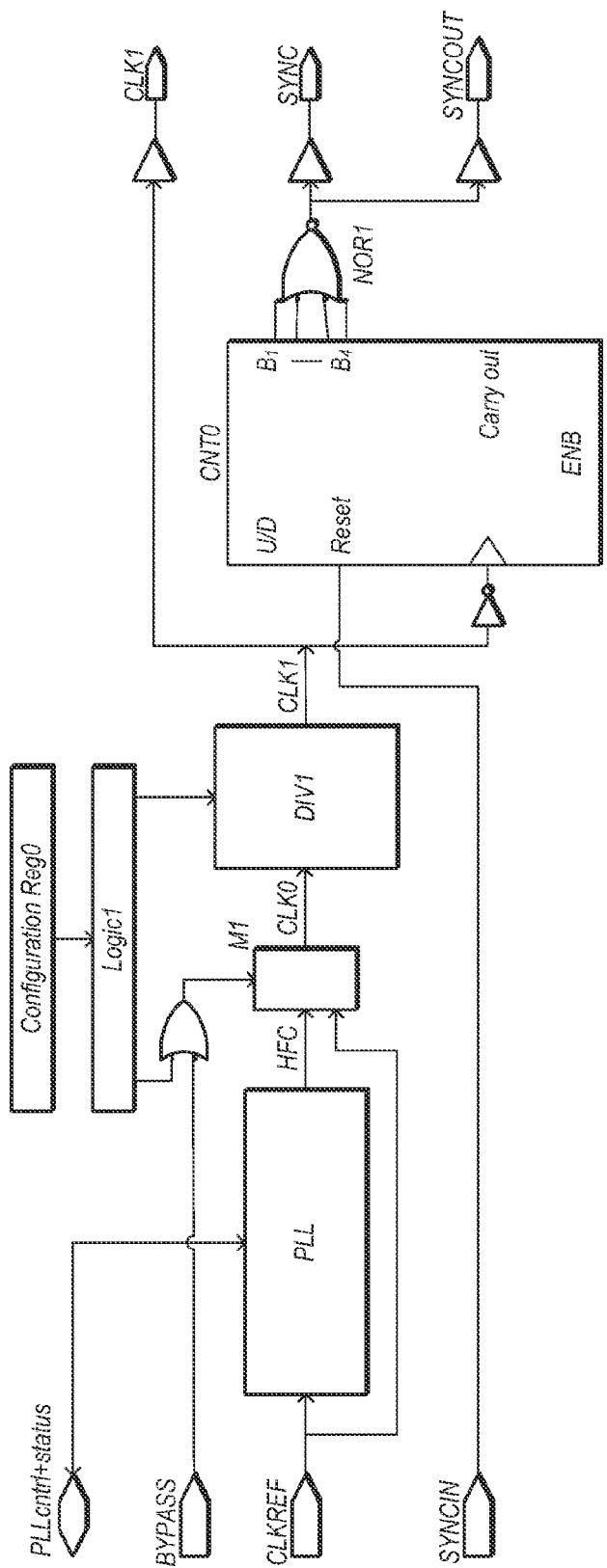
FIG. 5 is a block diagram of an embodiment of a clock and sync signal generator in a prior art system.

In the prior art shown in FIG. 5, the Reset input of CNT0 could be input from a chip pin (SYNC-IN), and it was hoped that this would slave one chip to another one that was providing a SYNC-OUT signal. However, this is problematic due to SYNC signal delays and distortion between chips. Thus, for inter-chip communication at the slower clock rates provided by the clock dividers in the I/O circuits, reset of the dividers needs to be more effectively synchronized between chips.

Clock dividers do not have unlimited range (which may require unlimited power dissipation). For low power applications a range of $2^4=16$ is useful. The range limitation of the clock dividers also limits the PLL clock multiplication factor as shown in the following analysis, which refers to the exemplary embodiment of FIG. 7.

Let the frequency of CLK1 be fclk1, and the frequency of CLKREF be fclkref.

fclk1=M*fclkref, where M is the PLL multiplication factor, typically $2^i$, where i is an integer.

By driving CLKREF into the reset input of CNT0 which is clocked by CLK1, we have that the minimum frequency of SYNC is:

fsync=fclkref

If fclk1 is fclkref/2 or less, then CNT0 does not count faster than it is reset, so it effectively does not count beyond the 0000 state.

When M=$2^i$, this places a minimum on i of 0, and minimum M of 1.

Let D0=$2^{j0}$ be the rollover count of CNT0, then:

fsync=fclkref for i=0 to j0, and fsync=fclkref M/D0 for i>j0.

For example, when CNT0 is fixed at 4 bits, it rolls over every 16 pulses of CLK1 and a SYNC pulse is emitted. For example, if M were 32 the SYNC frequency would be twice fclkref, but it would remain phase-aligned to CLKREF due to that periodic reset input.

In one embodiment, the value of j0 may fixed at 4, and the PLL multiplier may be fixed at i=4 (M=16) to clock CNT0. Further downstream, another divider (not in the Figures) may divide the signal CLK1 by $2^k$, where 0<k<4, on its way to the rest of the chip. This can lower CLK1 for the rest of the chip (e.g., to reduce chip power dissipation) without affecting CNT0 clocking.

Figure 3:
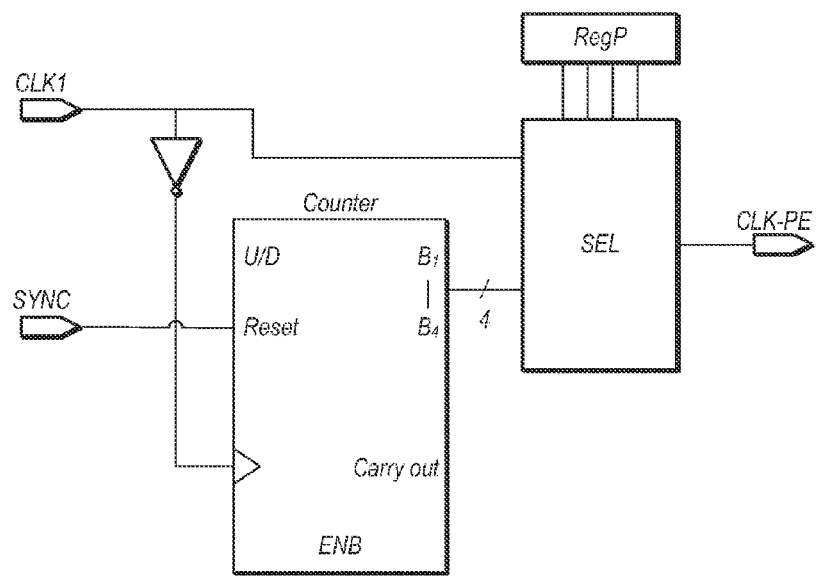
FIG. 3 is a block diagram of an embodiment of a clock divider in a prior art system.
Figure 4:
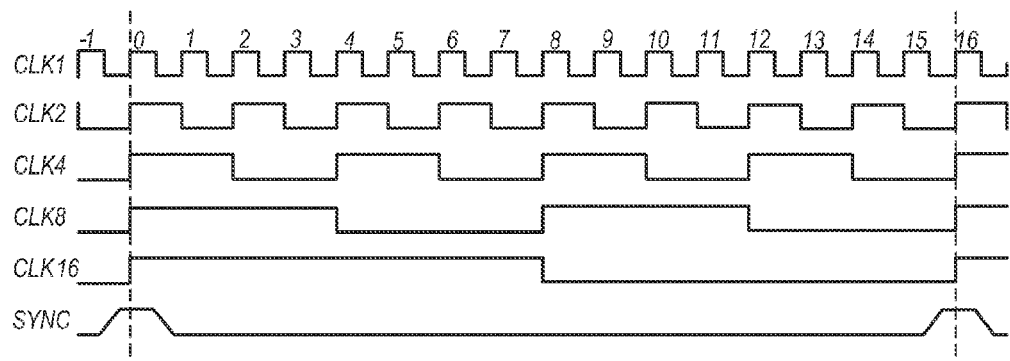
FIG. 4 depicts example clock divider waveforms in a prior art system.

As noted above, each I/O circuit may be served by a clock regenerator comprising a clock divider, as shown in FIG. 3, such that the input clock to the I/O circuit is a divided clock signal with frequency fio:

fio=fclk1/Dio, where Dio is the divider ratio, typically $2^j$, where 0<j<jmax.

Substituting fclk1=Mio*fclkref, we find the fio dependencies:

fio=fclkref*Mio/Dio, where Mio is the ratio fclk1/fclkref at the regenerator that serves the I/O circuitry.

For reliable data transfer between the I/O circuits of two chips, respectively numbered 1 and 2, the transmit and receive clock rates should be the same:

fio1=fio2.

Substituting, and dividing both sides of the equality by fclkref, we find Rule1:

Mio1/Dio1=Mio2/Dio2.

For proper clock divider use of the SYNC input, each fio should be greater than or equal to fsync.

Example of symmetric settings: Mio1=16, Dio1=2, Mio2=16, Dio2=2.

Example of asymmetric settings: Mio1=16, Dio1=4, Mio2=8, Dio2=2.

This means that two chips running different core CLK1 rates may communicate by making their communication I/O clock dividers conform to Rule1, and the above limitations on maximum and minimum values of Mio, Dio, and fio.

Figure 18:
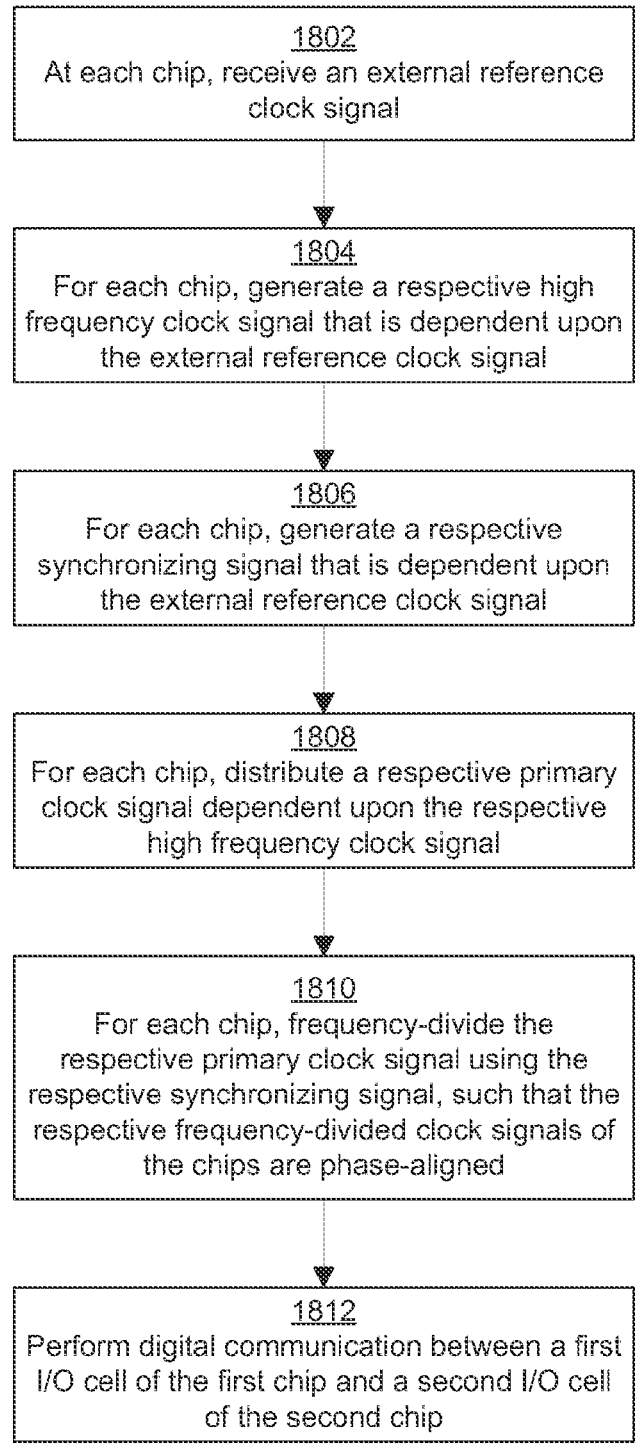
FIG. 18 is a flowchart diagram illustrating an embodiment of a method for synchronizing digital communications between a first IC chip and a second IC chip.

FIG. 18 is a flowchart diagram illustrating an embodiment of a method for synchronizing digital communications between a first IC chip and a second IC chip. The method shown in FIG. 18 may be used in conjunction with the exemplary systems of FIGS. 6-7 and 16-17, among other systems. In some embodiments, similar methods may be applied for synchronizing digital communications between larger numbers of chips.

In step 1802, an external reference clock signal may be received by each of the first IC chip and the second IC chip. For example, in the embodiment of FIG. 16, the external reference clock signal generated by oscillator OSC1 is received via the CLKREF input pins of each chip. In some embodiments, the respective propagation delays between OSC1 and the respective CLKREF input pins of the two chips are closely matched, such that clock skew is minimized between the CLKREF signals of the two chips.

In step 1804, each chip may generate a respective high frequency clock signal that is dependent upon the external reference clock signal. For example, in some embodiments, the high frequency clock signal may have a frequency that is a configurable multiple of a frequency of the reference clock. In the exemplary embodiment of FIG. 7, the high frequency clock signal HFC is generated by the PLL, which receives as an input external reference clock signal CLKREF. The PLL may output signal HFC having a frequency that is a configurable multiple of a frequency of CLKREF, as known in the art.

In step 1806, each chip may generate a respective synchronizing signal that is dependent upon the external reference clock signal, such that the respective synchronizing signals of the first chip and the second chip are phase-aligned as a result of their common dependence upon the external reference clock signal. For example, in the embodiment of FIG. 7, a chip generates synchronizing signal SYNC, which is dependent upon external reference clock signal CLKREF. Specifically, as illustrated in FIG. 7, SYNC will be high for one clock cycle of primary clock signal CLK1 when counter CNT0 outputs a count of zero. Because CNT0 is clocked by primary clock signal CLK1, SYNC is edge-aligned with CLK1. In this context, two signals are "edge-aligned" if their transition periods overlap in time. Because CNT0 is reset to a count of zero by signal CLKREFrising in response to a rising edge of CLKREF, the respective SYNC signals of the two chips will be phase-aligned with each other by virtue of their mutual phase-alignment with CLKREF, if skew is minimized between the CLKREF signals of the two chips. In this context, two signals are "phase-aligned" if their transitions occur within the same clock cycle of the primary clock signal.

Figure 2:
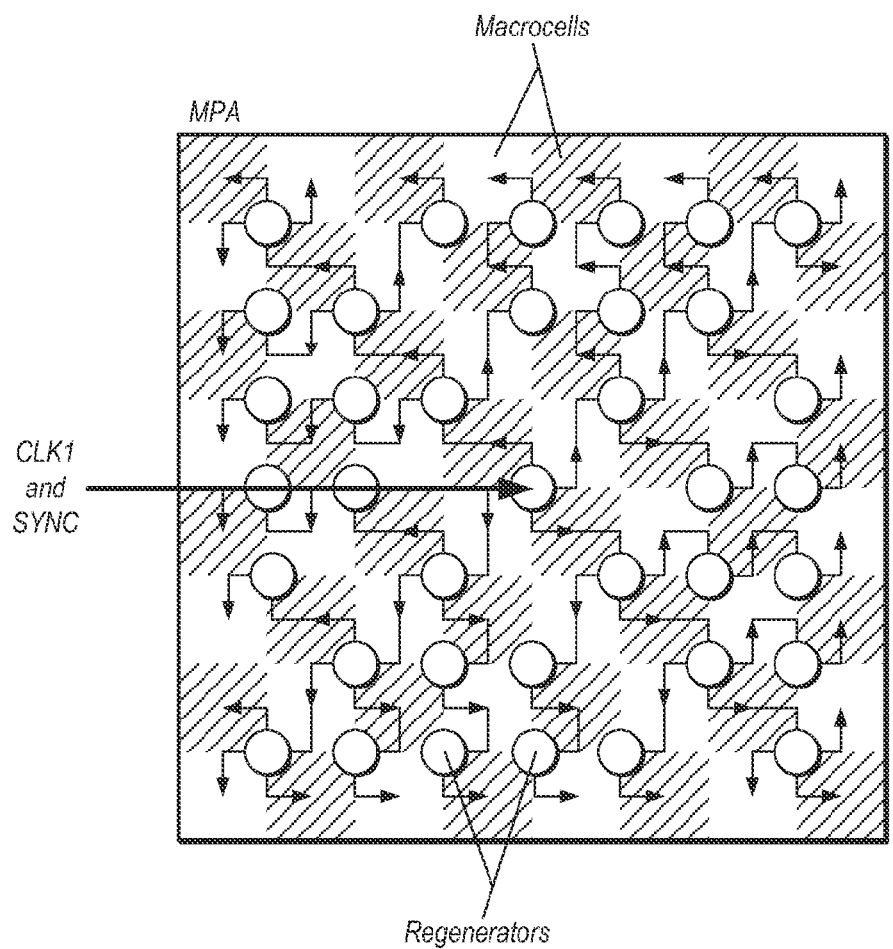
FIG. 2 is a block diagram illustrating an embodiment of a clock distribution network in a prior art system.

In step 1808, each chip may distribute, to a respective synchronous digital system comprised on the chip, a respective primary clock signal dependent upon the chip's respective high frequency clock signal. The primary clock signal is distributed via a clock distribution network of the synchronous digital system, such as the clock distribution network illustrated in FIG. 2.

The chip may include a plurality of I/O cells, as illustrated in the exemplary embodiment of FIG. 16. As the primary clock signal is distributed through the clock distribution network to the I/O cells, it will incur propagation delay, as well as delay introduced by buffers or other circuitry. In some embodiments, the clock distribution network may be configured to provide a uniform delay between the high frequency clock signal and each of the I/O cells, so as to minimize clock skew between the delayed versions of the primary clock received by each of the I/O cells. Optimally, the delayed versions of the primary clock received by each of the I/O cells are edge-aligned with each other. A uniform delay may be similarly provided for the synchronizing signal.

In step 1810, each chip may frequency-divide the respective primary clock signal using the chip's respective synchronizing signal. The frequency-divided clock signal may have a frequency that is less than the frequency of the chip's primary clock signal. FIG. 3 illustrates a block diagram of an exemplary embodiment of a clock divider that may be used in step 1810. As illustrated in FIG. 3, a clock pulse may be generated using any of the output bits of a Counter. The Counter is reset by synchronizing signal SYNC. Because the respective SYNC signals of the two chips are phase-aligned with each other, the frequency-divided clock signals of the two chips will be phase-aligned with each other.

In step 1812, digital communication may be performed between a first I/O cell of the first chip and a second I/O cell of the second chip. The first I/O cell may use as a clock the frequency-divided clock signal of the first chip, and the second I/O cell may use as a clock the frequency-divided clock signal of the second chip, as shown in the exemplary embodiment of FIG. 16. Because the frequency-divided clock signals of the two chips are at least phase-aligned, if the frequency-divided clock signals of the two chips share the same frequency, then the digital communication between the two I/O cells may be considered to be synchronous communication.

In some embodiments, PLLs with feedback paths, such as the one illustrated in FIG. 17, may be used to further align the frequency-divided clock signals of the two chips. For example, a feedback path on each chip may parallel the respective primary clock signal from the HFC output of the PLL to the clock divider that frequency-divides the respective primary clock signal. This clock divider may be located near an I/O cell of the chip. As discussed above, this may result in respective primary clock signal CLK1 at the I/O cell of the first chip being edge-aligned to the respective primary clock signal CLK1 at the I/O cell of the second chip. Optimally, because the respective primary clock signals of the two chips are edge-aligned with each other, the frequency-divided clock signals of the two chips will also be edge-aligned with each other.

Because SYNC is not a clock, but a reset signal for the clock dividers, it does not affect the clock skew of the I/O circuits, except to keep the clock dividers for each and every I/O circuit synchronized to within one cycle of the HFC.

Although the above embodiments have been described in connection with the preferred embodiment, it is not intended to be limited to the specific form set forth herein, but on the contrary, it is intended to cover such alternatives, modifications, and equivalents, as can be reasonably included within the spirit and scope of the embodiments of the invention as defined by the appended claims.

What is claimed is:

1. An apparatus comprising:
a reference clock generator configured to generate a reference clock signal; and
a plurality of integrated circuit chips, each chip of the plurality of integrated circuit chips comprising:
clock generation circuitry configured to generate a primary clock signal dependent upon the reference clock signal;
synchronizing signal generation circuitry configured to generate a synchronizing signal that is edge-aligned to the primary clock signal, wherein the respective synchronizing signals of the plurality of chips are phase-aligned as a result of their common dependence upon the reference clock signal;
clock divider circuitry configured to:
receive a delayed version of the primary clock signal and a delayed version of the synchronizing signal; and
generate a frequency-adjusted clock signal having a frequency that is a function of a frequency of the delayed version of the primary clock signal, wherein the frequency-adjusted clock signal is edge-aligned to the delayed version of the primary clock signal and phase-aligned to the delayed version of the synchronizing signal; and
input/output (I/O) circuitry configured to:
receive as a clock input the frequency-adjusted clock signal; and
communicate with the respective I/O circuitry of another chip of the plurality of chips;
wherein a first chip of the plurality of integrated circuit chips is configured to generate a respective primary clock signal at a first frequency, and a second chip of the plurality of integrated circuit chips is configured to generate a respective primary clock signal at a second, different frequency, wherein both the first chip and the second chip are configured to generate respective frequency-adjusted clock signals at a third frequency, wherein the frequency-adjusted clock signal of the first chip is phase-aligned with the frequency-adjusted clock signal of the second chip.

2. The apparatus of claim 1, wherein, for each chip of the plurality of chips, the clock generation circuitry comprises:
a phase-locked loop (PLL) configured to receive the reference clock signal and generate a high frequency clock signal that has a frequency higher than a frequency of the reference clock signal.

3. The apparatus of claim 1, wherein the I/O circuitry of each chip comprises a plurality of I/O cells, and wherein each chip of the plurality of chips further comprises:
a clock and synchronization signal distribution network, comprising:
a feed point configured to receive the primary clock signal and the synchronization signal;
fan-out circuitry connected to the feed point, the fan-out circuitry configured to propagate the primary clock signal and the synchronization signal from the feed point to the I/O circuitry, the primary clock signal and the synchronization signal each having uniform delay between the feed point and each I/O cell of the plurality of I/O cells; and
a plurality of regenerators positioned throughout the fan-out circuitry.

4. The apparatus of claim 3, wherein, for each chip of the plurality of chips, the clock generation circuitry comprises:
a phase-locked loop (PLL) configured to:
receive the reference clock signal;
generate a high frequency clock signal output; and
receive a feedback signal that is a delayed copy of the high frequency clock signal, wherein the feedback signal is phase-locked to the reference clock signal; and
a feedback path for the phase-locked loop (PLL), wherein the feedback path parallels the primary clock signal through the clock and synchronization signal distribution network from the high-frequency clock output to a regenerator that serves a first I/O cell of the plurality of I/O cells, wherein the first I/O cell is located near the PLL, wherein the feedback path is provided to a feedback input of the PLL.

5. The apparatus of claim 1, wherein, for each chip of the plurality of chips, the synchronizing signal generation circuitry comprises:
an edge detector configured to detect a clock edge of the reference clock signal; and
a counter configured to:
update a count value based on the primary clock signal;
reset the count value based on the output of the edge detector; and
output a pulse of the synchronizing signal when the count value is equal to a specific value.

6. The apparatus of claim 1, wherein a first propagation delay of the reference clock signal between the reference clock generator and the first chip is approximately equal to a second propagation delay between the reference clock generator and the second chip, wherein clock skew is minimized between the reference clock signal received by the first chip and the reference clock signal received by the second chip.

7. The apparatus of claim 1, wherein a first propagation delay of the respective primary clock signal between the clock generation circuitry of the first chip and the clock divider circuitry of the first chip is approximately equal to a second propagation delay of the respective primary clock signal between the clock generation circuitry of the second chip and the clock divider circuitry of the second chip.

8. A method for synchronizing digital communications between a first chip and a second chip, the method comprising:
at each of the first chip and the second chip:
receiving an external reference clock signal;
generating, on the chip, a respective synchronizing signal dependent upon the external reference clock signal, wherein the respective synchronizing signals of the first chip and the second chip are phase-aligned as a result of their common dependence upon the external reference clock signal;
generating, on the chip, a respective primary clock signal dependent upon the external reference clock signal, wherein a frequency of the primary clock signal of the first chip is different than a frequency of the primary clock signal of the second chip;
distributing, to a respective synchronous digital system comprised on the chip, the respective synchronizing signal and the respective primary clock signal, wherein the primary clock signal at each of a respective plurality of I/O cells of the chip is uniformly delayed from the location at which the primary clock signal is generated; and
generating a respective first frequency-adjusted clock signal having a frequency that is a function of a frequency of the respective primary clock signal, wherein the frequency of the first frequency-adjusted clock signal of the first chip is the same as a frequency of the first frequency-adjusted clock signal of the second chip, and wherein the generating the respective first frequency-adjusted clock signal uses the respective synchronizing signal such that the respective first frequency-adjusted clock signals of the first chip and the second chip are phase-aligned; and performing digital communication between a first I/O cell of the plurality of I/O cells of the first chip and a second I/O cell of the plurality of I/O cells of the second chip, wherein the first I/O cell uses as a clock input the first frequency-adjusted clock signal of the first chip, and the second I/O cell uses as a clock input the first frequency-adjusted clock signal of the second chip.

9. The method of claim 8, wherein the generating the respective synchronizing signal comprises:
determining an edge of the external reference clock signal; and
generating, in response to the determining the edge of the external reference clock signal, a pulse of the synchronization signal.

10. The method of claim 9, wherein the generating the pulse of the synchronization signal comprises resetting a counter configured to output a pulse upon reaching a specific counter value, wherein the counter uses as a clock input the primary clock signal.

11. The method of claim 8, wherein the generating the primary clock signal comprises generating a respective high frequency clock signal having a frequency that is a configurable multiple of a frequency of the reference clock, wherein the respective primary clock signal is dependent upon the respective high frequency clock signal.

12. The method of claim 11, wherein the generating the respective high frequency clock signal comprises outputting a high frequency clock signal from a phase-locked loop (PLL).

13. The method of claim 12, wherein the generating the respective high frequency clock signal further comprises:
providing to the PLL a feedback signal, wherein a path of the feedback signal parallels a path of the primary clock signal from a feed point to an I/O cell of the plurality of I/O cells of the chip.

14. The method of claim 8, wherein the generating the first frequency-adjusted clock signal of the first chip is performed near the first I/O cell, and the generating the first frequency-adjusted clock signal of the second chip is performed near the second I/O cell.

15. The method of claim 8, further comprising:
frequency-adjusting the primary clock signal of the first chip to generate a second frequency-adjusted clock signal of the first chip, the second frequency-adjusted clock signal of the first chip having a frequency that is a function of the frequency of the primary clock signal of the first chip and different than the first frequency-adjusted clock signal of the first chip, wherein the frequency-adjusting uses the respective synchronizing signal;
performing digital communication using a third I/O cell of the plurality of I/O cells of the first chip, wherein the third I/O cell uses as a clock input the second frequency-adjusted clock signal of the first chip.

16. An integrated circuit chip comprising:
clock generation circuitry configured to generate a primary clock signal dependent upon a received reference clock signal;
synchronizing signal generation circuitry configured to generate a synchronizing signal that is edge-aligned to the primary clock signal;
clock divider circuitry configured to:
generate a frequency-adjusted clock signal having a frequency that is a function of a frequency of the primary clock signal, wherein the frequency-adjusted clock signal is edge-aligned to the primary clock signal and phase-aligned to the synchronizing signal; and
input/output (I/O) circuitry configured to:
receive as a clock input the frequency-adjusted clock signal; and
communicate with the I/O circuitry of a second chip, wherein a primary clock signal of the second chip has a frequency that is different than the frequency of the primary clock signal of the integrated circuit chip, wherein a clock signal of the I/O circuitry of the second chip has a frequency that is the same as the frequency-adjusted clock signal, and wherein the clock signal of the I/O circuitry of the second chip is phase-aligned with the frequency-adjusted clock signal.

17. The integrated circuit chip of claim 16, wherein the clock generation circuitry comprises:
a phase-locked loop (PLL) configured to receive the reference clock signal and generate a high frequency clock signal that has a frequency higher than a frequency of the reference clock signal.

18. The integrated circuit chip of claim 16, wherein the I/O circuitry comprises a plurality of I/O cells, the integrated circuit chip further comprising:
a clock and synchronization signal distribution network, comprising:
a feed point configured to receive the primary clock signal and the synchronization signal;
fan-out circuitry connected to the feed point, the fan-out circuitry configured to propagate the primary clock signal and the synchronization signal from the feed point to the I/O circuitry, the primary clock signal and the synchronization signal each having uniform delay between the feed point and each I/O cell of the plurality of I/O cells; and
a plurality of regenerators positioned throughout the fan-out circuitry.

19. The integrated circuit chip of claim 18, wherein the clock generation circuitry comprises:
a phase-locked loop (PLL) configured to:
receive the reference clock signal;
generate a high frequency clock signal output; and
receive a feedback signal that is a delayed copy of the high frequency clock signal, wherein the feedback signal is phase-locked to the reference clock signal; and
a feedback path for the phase-locked loop (PLL), wherein the feedback path parallels the primary clock signal through the clock and synchronization signal distribution network from the high-frequency clock output to a regenerator that serves a first I/O cell of the plurality of I/O cells, wherein the first I/O cell is located near the PLL, wherein the feedback path is provided to a feedback input of the PLL.

20. The integrated circuit chip of claim 16, wherein the synchronizing signal generation circuitry comprises:
an edge detector configured to detect a clock edge of the reference clock signal; and
a counter configured to:
update a count value based on the primary clock signal;

reset the count value based on the output of the edge detector; and output a pulse of the synchronizing signal when the count value is equal to a specific value.

* * * * *